United States Patent
Chappaz

(10) Patent No.: US 8,627,187 B2
(45) Date of Patent: Jan. 7, 2014

(54) DECODING OF RECURSIVE CONVOLUTIONAL CODES BY MEANS OF A DECODER FOR NON-RECURSIVE CONVOLUTIONAL CODES

(75) Inventor: David Franck Chappaz, Milton (GB)

(73) Assignee: Cambridge Silicon Radio Limited, Cambridge (GB)

( * ) Notice: Subject to any disclaimer, the term of this patent is extended or adjusted under 35 U.S.C. 154(b) by 559 days.

(21) Appl. No.: 12/663,167

(22) PCT Filed: May 12, 2008

(86) PCT No.: PCT/GB2008/001626
§ 371 (c)(1),
(2), (4) Date: Dec. 4, 2009

(87) PCT Pub. No.: WO2008/149056
PCT Pub. Date: Dec. 11, 2008

(65) Prior Publication Data
US 2010/0185923 A1   Jul. 22, 2010

(30) Foreign Application Priority Data
Jun. 5, 2007   (GB) .................................. 0710766.7

(51) Int. Cl.
*H03M 13/00* (2006.01)
(52) U.S. Cl.
USPC ........................................................ 714/786
(58) Field of Classification Search
USPC ........................................................ 714/786
See application file for complete search history.

(56) References Cited

U.S. PATENT DOCUMENTS

| | | | | |
|---|---|---|---|---|
| 4,517,596 A | * | 5/1985 | Suzuki | 375/240.05 |
| 6,044,116 A | * | 3/2000 | Wang | 375/265 |
| 6,141,391 A | | 10/2000 | Morelos-Zaragoza et al. | |

(Continued)

FOREIGN PATENT DOCUMENTS

| | | |
|---|---|---|
| JP | 04-032317 | 2/1992 |
| JP | 05-244019 | 9/1993 |
| JP | 06-181443 | 6/1994 |
| JP | 2002-530991 | 9/2002 |

OTHER PUBLICATIONS

Hindelang T. et al, "*Channel Coding Techniques for Adaptive Multi Rate Speech Transmission*", IEEE International Conference on Communications, 2000, vol. 2, June 18, 2000, pp. 744-748, XP001208750, New Orleans,USA, ISBN, 978-0-7803-6284-0.

(Continued)

*Primary Examiner* — Amine Riad
(74) *Attorney, Agent, or Firm* — RatnerPrestia

(57) ABSTRACT

Embodiments of the invention provide a decoder arrangement (400), wherein a decoder (420) which is adapted to decode a bitstream which has been encoded with a non-recursive convolutional encoder is used to at least partially perform the decoding of a recursive convolutionally encoded bitstream, with pre-or post-processing (410) of the bitstream being performed to complete the decoding. More particularly, in one embodiment of the invention a recursively encoded bitstream is input into a conventional decoder (420) which is adapted to decode a non-recursively encoded bitstream. The resulting intermediate output does not represent the correct decoded bitstream, but can then be subject to a post-processing step in the form of a non-recursive encoding operation (410), which effectively completes the decoding operation and provides as its output the correct decoded bitstream. Both hard decision or soft decision inputs can be used.

34 Claims, 24 Drawing Sheets

(56) References Cited

U.S. PATENT DOCUMENTS

| | | | |
|---|---|---|---|
| 6,760,385 B1 | 7/2004 | Goodson | |
| 6,973,614 B1 | 12/2005 | Hagenauer et al. | |
| 7,770,093 B2 * | 8/2010 | Divsalar et al. | 714/794 |
| 7,774,689 B2 * | 8/2010 | Chiu et al. | 714/786 |
| 8,086,943 B2 * | 12/2011 | Divsalar et al. | 714/794 |
| 2005/0138535 A1 * | 6/2005 | Parthasarathy et al. | 714/796 |
| 2008/0247442 A1 * | 10/2008 | Orlik et al. | 375/138 |
| 2010/0287453 A1 * | 11/2010 | Balachandran et al. | 714/790 |

OTHER PUBLICATIONS

Ma Xiao et al, "*Soft-Input Soft-Output Algorithms for Recursive Convolutional Codes*", Electronic Letters, IEE Stevenage, GB, vol. 35, No, 2, Jan. 21, 1999, pp. 1-2, XP006011671, ISSN: 0013-5194.

Joachin Hagenauer et al, "Interative Decoding of Binary Block and Convolutional Codes", IEEE Transctions on Information Theory, US, vol. 42, No. 2, Mar. 1, 1996, XP011026493, ISSN: 0018-9448, pp. 429-430.

Bolinth, E., "Algorithm to Convert Non-Systematic Feed-Forward Convolutional Codes of Rate R=K/N to Recursive Systematic Codes", International OFDM Workshop, Aug. 31, 2005, pp. 1-6, XP009064405.

Hagenauer, "Source-Controlled Channel Decoding", IEEE Transactions on Communications, 43 Sep. 1995, No. 9, pp. 2549-2557.

Japanese Office Action dated Mar. 27, 2012.

* cited by examiner

Non-Recursive encoder:

$g1(D) = 1 + D + D2$
$g2(D) = 1 + D2$ which translates into:

$y_{1,n} = u_n + u_{n-1} + u_{n-2}$
$y_{2,n} = u_n + u_{n-2}$

Recursive part of the encoder:
$g0(D) = 1 + D$ which translates into:
$u_n = x_n + u_{n-1}$ Non-Recursive part of the encoder:

$g1(D) = 1 + D + D2$
$g2(D) = 1 \phantom{+ D} + D2$ which translates into:

$y_{1,n} = u_n + u_{n-1} + u_{n-2}$
$y_{2,n} = u_n \phantom{+ u_{n-1}} + u_{n-2}$

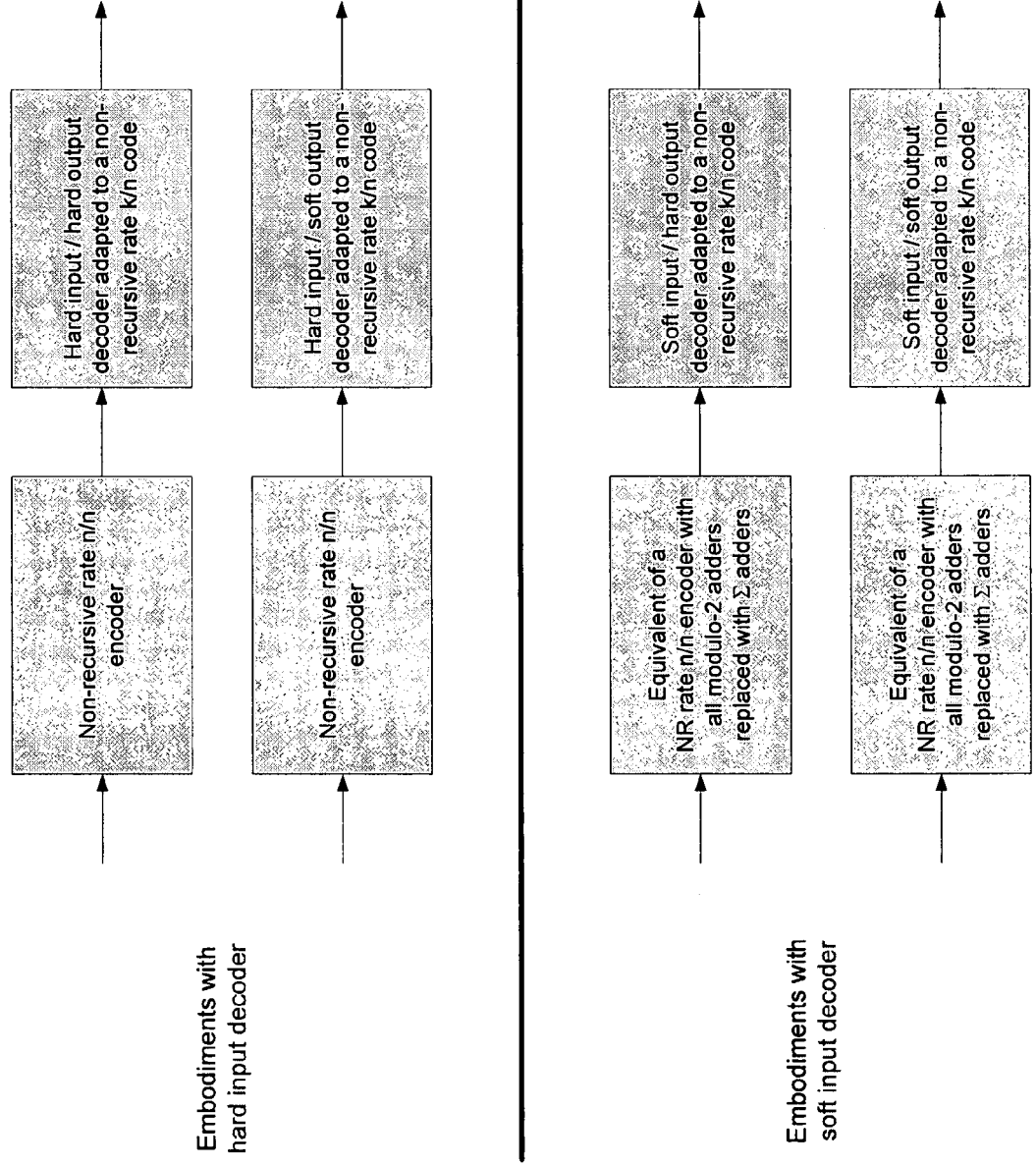

US 8,627,187 B2

DECODING OF RECURSIVE CONVOLUTIONAL CODES BY MEANS OF A DECODER FOR NON-RECURSIVE CONVOLUTIONAL CODES

REFERENCE TO RELATED APPLICATIONS

The present application is the U.S. national phase of PCT International Patent Application No. PCT/GB2008/001626, filed May 12, 2008, published in English on Dec. 11, 2008, as WO 2008/149056 A1, which claims the benefit of U.K. Patent Application No. 0710766.7, filed Jun. 5, 2007. The disclosure of the above-referenced applications are hereby incorporated by reference in their entireties into the present disclosure.

TECHNICAL FIELD

The present invention relates to a decoder arrangement for decoding a bitstream which has been coded with a recursive convolutional encoder, but which is able to make use of a decoder adapted for decoding a non-recursive code.

BACKGROUND TO THE INVENTION AND PRIOR ART

Within a typical digital communications system, information is represented as a sequence of binary bits. To transmit the information, the binary bits are modulated onto an analogue signal waveform, and transmitted over a telecommunications channel. The communication channel will typically introduce noise and interference that corrupt the transmitted signal. At the receiver, the corrupted received signal is mapped back into the digital domain, but due to the introduced noise, bit errors may result.

In order to compensate for bit errors, channel coding is often used in digital communications systems to allow for error detection and correction to occur. Channel coding is most often accomplished by selectively introducing redundant bits into the transmitted bitstream. These additional bits allow detection and correction of bit errors in a received datastream. Using channel coding to obtain this effect, however, leads to a reduction in data rate, or an increase in the bandwidth required to transmit the same amount of information.

There are two main types of channel codes, being block codes and convolutional codes. Convolutional codes are one of the most widely used channel codes in practical communications systems. Convolutional codes are commonly specified by three parameters, being the number of output bits n, the number of input bits k, and the number of memory registers m. The ratio between the number of input bits and the number of output bits is called the code rate r. Typically in order to introduce redundancy into the coded bitstream; the number of output bits will be greater than the number of input bits.

There are basically two types of convolutional encoder already known in the art. FIG. 1 illustrates a first kind of encoder, which is a non-recursive encoder, wherein the output bits are dependent upon the present input bit and the previous input bits. More particularly, FIG. 1 illustrates a rate 1/2 encoder, such that two output bits are output for every input bit.

More particularly, the 1/2 rate non-recursive encoder 110 of FIG. 1 comprises an input line 116 which inputs a bitstream $x_n$ to be encoded into the encoder. One bit delays 118 and 120 are provided, such that at the input to the encoder the present bit is represented as $u_n$, the previous bit is represented after delay 118 as bit $u_{n-1}$, and the second previous bit which had undergone both delays 118 and 120 is represented as $u_{n-2}$. A first modulo-2 adder 112 is provided, as is a second modulo-2 adder 114. The respective outputs 130 and 132 from the adders 112 and 114 output the coded bitstreams $y_{1,n}$ and $y_{2,n}$. As mentioned, because this is a rate 1/2 encoder, two output bits are obtained for every input bit.

Typically, as is well known, the configuration of a convolutional encoder is defined by what is known as a set of generator polynomials $G=(g_1, g_2, \ldots, g_n)$ (referred to further herein as the generator matrix). More particularly, each generator polynomial $g_1$, $g_2$, etc. defines the inputs to the modulo-2 adders, in terms of which of the present and previous bits are input to the adders for modulo-2 addition to then be performed thereon, to produce an output. Within the example 1/2 rate non-recursive encoder of FIG. 1, the first generator polynomial is:

$$g_1(D)=1+D+D^2$$

which means that the first modulo-2 adder 112 outputting the first coded output bit on output line 130 receives both the present input bit, plus the input bit $u_{n-1}$ subject to a first delay, plus the previous input bit $u_{n-2}$ subject to both delays 118 and 120. In FIG. 1 it can be seen that line 122 connects the present input bit to the modulo-2 adder 112, whereas line 124 connects the previous bit $u_{n-1}$ to the adder, and line 126 connects the bit before that $u_{n-2}$ to the adder.

A generator polynomial is provided for each modulo-2 adder, and hence it will be seen that in FIG. 1 a second generator polynomial $g_2$ is provided, wherein:

$$g_2(D)=1+D^2$$

This means, as can be seen, that the second modulo-2 adder 114 receives the input bit $u_n$ via line 128, as well as the twice delayed previous bit $u_{n-2}$ via line 126. The adder 114 performs modulo-2 addition on these inputs, to provide a second output bit for every input bit. As is known, to encode an input bitstream using a non-recursive encoder of the type shown in FIG. 1, the bitstream is input into the encoder one bit at a time, and the two coded bitstreams are then read out from the outputs 130 and 132. Typically, for transmission the two coded bitstreams would be interleaved to form a single bitstream.

A second type of convolutional encoder is shown in FIG. 2. This is known as a recursive convolutional encoder, wherein the coded output bits are dependent not only on the current input bit, but also on previous "state" bits. Such "state" bits are, as shown in FIG. 2, bits taken from within the internal processing of the encoder (i.e. bit $u_{n-1}$ in FIG. 2) and which are then fed back to the input of the encoder. Due to the feedback of previous "state" bits to the recursive encoder input, the set of generator polynomials of a recursive convolutional encoder is typically of the form:—

$$G = \left(\frac{g1}{g0}, \frac{g2}{g0}, \ldots, \frac{gm}{g0}\right)$$

An example recursive convolutional encoder is shown in FIG. 2. Here the recursive convolutional encoder 210 comprises an input line 216 upon which an input bitstream $x_n$ to be encoded is input. The input 216 feeds into a first modulo-2 adder 234, which provides an output line wherein the result of the modulo-2 addition performed thereby is provided as bit $u_n$. $u_n$ is input to a first delay 218 which has an output line 224 on which a first delayed bit $u_{n-1}$ is provided which inputs into a second delay 220, to provide a second delayed bit $u_{n-2}$, on line 226. A second modulo-2 adder 212 is provided, the output of which on line 230 provides a first coded output bit, and a third modulo-2 adder 214 is also provided, the output of which on line 232 provides the second coded output bit, for every input bit. As can be seen, the output of the first modulo-2 adder 234 is input into the second modulo-2 adder 212 via line 222, and into the third modulo-2 adder 214, via line 228. Additionally, the second modulo-2 adder 212 receives the first delayed bit $u_{n-1}$ via line 224, as well as the second delayed bit $u_{n-2}$, via line 226. The third modulo-2 adder 214 does not receive the first delayed bit $u_{n-1}$, but does receive the second delayed input bit $u_{n-2}$, via line 226. To provide the recursive operation, the first modulo-2 adder 234, in addition to receiving the input bitstream, also receives the first delayed bit $u_{n-1}$, via line 236. In view of the above arrangement, and as shown in FIG. 2, the generator polynomials for the recursive encoder shown in FIG. 2 are:—

$$g0(D)=1+D;$$

$$g1(D)=1+D+D^2; \text{ and}$$

$$g2(D)=1+D^2$$

The encoders of FIGS. 1 and 2 relate to rate 1/2 codes i.e. one input bit produces two output bits. More generally however, rate k/n codes are also possible, where k is greater than or equal to 1, and n is greater than or equal to k such that k input bits are encoded into n output bits. Such codes are defined by a set of generator polynomials, represented as a matrix with k rows and n columns, as shown below:—

$$G_{RCE}(D) = \begin{bmatrix} \frac{g_{1,1}}{g_{1,0}} & \cdots & \cdots & \cdots & \frac{g_{1,n}}{g_{1,0}} \\ \vdots & \ddots & & & \vdots \\ \vdots & & \ddots & & \vdots \\ \vdots & & & \ddots & \vdots \\ \frac{g_{k,1}}{g_{k,0}} & \cdots & \cdots & \cdots & \frac{g_{k,n}}{g_{k,0}} \end{bmatrix}$$

Generally speaking, within the above generator matrix, $g_{k,n}$ represents how the kth input contributes to the nth output, whereas $g_{k,0}$ represents the feedback connection for the kth input. Each input may have a different feedback polynomial, as shown.

An example rate 2/3 recursive encoder typical of those known in the art is shown in FIG. 3. Here, the rate 2/3 recursive encoder 710 has two inputs 712 and 714, on which are respectively received input bitstreams $x_{1,n}$ and $x_{2,n}$. The first input line 712 inputs the first bitstream $x_{1,n}$ into a first modulo-2 adder 716, which provides an output state bit $u_{1,n}$ to a first one bit delay 720. Additionally, first feed forward line 736 feeds the state bit $u_{1,n}$ to a second modulo-2 adder 730, whereas second feed forward line 734 feeds the state bit $u_{1,n}$ to a third modulo-2 adder 728. The output of the one bit delay 720 is a second state bit $u_{1,n-1}$, which is fed by feed forward line 740 to the third modulo-2 adder 728, and also by feedback line 738 to the first modulo adder 716. The second state bit $u_{1,n-1}$ is also fed to a second delay 722, the output of which is third state bit $u_{1,n-2}$, which is fed to both the second modulo-2 adder 730, and the third modulo-2 adder 728 respectively. Thus, with respect to the state bits, the first state bit $u_{1,n}$ is the result of the modulo-2 addition of the present input bit $x_{1,n}$ and the second state bit $u_{1,n-1}$; the second state bit $u_{1,n-1}$ is the one bit delayed version of the first state bit $u_{1,n}$; and the third state bit $u_{1,n-2}$ is the one bit delayed version of the second state bit $u_{1,n-1}$. The third modulo-2 adder 728 outputs a first output bit $y_{1,n}$ on output line 750, being the result of the modulo-2 addition of each of the first, second and third state bits fed to the third modulo-2 adder 728.

Turning to the second input line 714, on which input bits $x_{2,n}$ are input, a fourth modulo-2 adder 718 receives the input bitstream $x_{2,n}$ on line 714, and outputs a fourth state bit $u_{2,n}$ to a third one bit delay 724, and also, via feed forward line 746, to a fifth modulo-2 adder 732. The one bit delay 724 outputs a fifth state bit $u_{2,n-1}$ to a fourth one bit delay 726, and also, via feed forward line 742 to the second modulo-2 adder 730. The second one bit delay 726 outputs a sixth, state bit $u_{2,n-2}$ via line 748 to the second modulo-2 adder 730, and the fifth modulo-2 adder 732. Additionally, the sixth state bit $u_{2,n-2}$ is also fed back via feedback line 744 to the fourth modulo-2 adder 718 at input 714. The second modulo-2 adder 730 therefore receives as input the following state bits: $u_{1,n}, u_{1,n-2}, u_{2,n-1},$ and $u_{2,n-2}$. Output line 752 is provided from the second modulo adder 730, on which is output an output bitstream $y_{2,n}$. The fifth modulo-2 adder 732 receives the state bit $u_{2,n}$ and $u_{2,n-2}$ as inputs, and outputs on line 754 the third output bitstream $y_{3,n}$. With such an arrangement therefore, for each pair of input bits x1,n and x2,n, three output bits $y_{1,n}, y_{2,n},$ and $y_{3,n}$ are output. Additionally, in view of the above arrangement, and as shown in FIG. 3, the generator polynomials for the recursive rate 2/3 encoder shown in FIG. 3 are as follows:—

$$g_{1,1}(D)=1+D+D^2;$$

$$g_{1,2}(D)=1+D^2;$$

$$g_{1,3}(D)=0;$$

$$g_{2,1}(D)=0;$$

$$g_{2,2}(D)=D+D^2;$$

$$g_{2,3}(D)=1+D^2;$$

$$g_{1,0}(D)=1+D; \text{ and}$$

$$g_{2,0}(D)=1+D^2$$

Recursive encoders when compared to non-recursive encoders, whilst slightly more complicated, produce a coded output which has more "weight" i.e. has better error detection and correction properties. Non-recursive convolutional codes have conventionally been used in communications systems such as GSM or the like, but recently there has been introduced a requirement for recursive convolutional codes, because of their better performance characteristics. Conventionally, for a receiver to be able to decode both a non-recursive convolutionally encoded bitstream as well as a recursive convolutionally encoded bitstream, two separate decoders are required, one for the non-recursively coded bitstream, and another for the recursively coded bitstream. Two decoders are typically required because the branch labels in the state transition diagram are different for recursive and non-recursive encoders. Thus, to decode a non-recursively encoded bitstream a decoder particularly adapted to the target non-recursive encoder which produced the bitstream has conventionally been required, and likewise, to decode a recursively encoded bitstream, a decoder particularly adapted to the operation of the target recursive encoder which produced the bitstream has been required. Where the decoders are being implemented in hardware, for example on an integrated circuit, this leads to more silicon area being required, to implement the two decoders. Clearly, therefore, it would be beneficial if the requirement to have a particular decoder for every particular type of convolutional encoding could be removed, and a single, or at least a reduced subset, of decoders provided which can be used to decode both recursive and non-recursively encoded bitstreams.

SUMMARY OF THE INVENTION

To address the above embodiments of the invention provide a decoder arrangement, wherein a decoder which is adapted to decode a bitstream which has been encoded with a non-recursive convolutional encoder is used to at least partially perform the decoding of a recursive convolutionally encoded bitstream, with pre- or post-processing of the bitstream being performed to complete the decoding. More particularly, in one embodiment of the invention a recursively encoded bitstream is input into a conventional decoder which is adapted to decode a non-recursively encoded bitstream. The resulting intermediate output does not represent the correct decoded bitstream, but can then be subject to a post-processing step in the form of a non-recursive encoding operation, which effectively completes the decoding operation and provides as its output the correct decoded bitstream. In another embodiment, instead of the non-recursive encoding operation being performed as a post-processing step, it is performed as a pre-processing step, the output of which is then fed to the conventional decoder. The output of the conventional decoder is then the correct decoded bitstream. In a further embodiment, a soft decision decoder can be used adapted to decode a bitstream which has been encoded with a non-recursive encoder, and a pre- or post-processing step performed adapted to operate on soft decisions, but which is analogous to a hard decision non-recursive encoding, operation. Thus, in the further embodiment the principles of the invention can also be applied to provide a soft decision decoder, for use where soft-decision symbol detection is used in a receiver.

In view of the above, from a first aspect the present invention provides an apparatus for decoding a recursive convolutional encoded bitstream, comprising: a decoder adapted to decode a non-recursive convolutional encoded bitstream; and a post-processing element arranged to receive the output of the decoder and apply a post-processing operation thereto; the decoder and the post-processing element operable together in turn to decode a received recursive convolutional encoded bitstream to provide a decoded bitstream.

The advantage of the invention of the first aspect is that the same decoder can be used to decode both non-recursive convolutional codes and, with the post-processing step recursive convolutional codes. It is therefore no longer necessary to provide a separate dedicated decoder for both recursive and non-recursive codes.

In a preferred embodiment the decoder receives the recursive convolutional encoded bitstream and partially decodes the bitstream to provide an intermediately decoded bitstream; and the post-processing element receives the intermediately decoded bitstream and applies a post-processing operation thereto to provide the decoded bitstream. The preferred embodiment has the advantage that only one post-processing element is required per input bit stream of a target recursive convolutional encoder (generally there are k of them) to process the output of the decoder, and hence hardware implementations particularly are reduced in complexity.

In the preferred embodiment the recursive convolutional encoded bitstream has been encoded by a recursive convolutional encoder having generator polynomials:

$$G_{RCE}(D) = \begin{bmatrix} \frac{g_{1,1}}{g_{1,0}} & \cdots & \cdots & \cdots & \frac{g_{1,n}}{g_{1,0}} \\ \vdots & \ddots & & & \vdots \\ \vdots & & \ddots & & \vdots \\ \vdots & & & \ddots & \vdots \\ \frac{g_{k,1}}{g_{k,0}} & \cdots & \cdots & \cdots & \frac{g_{k,n}}{g_{k,0}} \end{bmatrix};$$

and the decoder is adapted to decode a non-recursive convolutional encoded bitstream produced by a non-recursive convolutional encoder having generator polynomials $$G_{NRCE}(D) = \begin{bmatrix} g_{1,1} & \cdots & \cdots & \cdots & g_{1,n} \\ \vdots & \ddots & & & \vdots \\ \vdots & & \ddots & & \vdots \\ \vdots & & & \ddots & \vdots \\ g_{k,1} & \cdots & \cdots & \cdots & g_{k,n} \end{bmatrix}$$

where k is greater than or equal to 1, and n is greater than or equal to k. In this case, k represents the number of inputs to the encoder, and n represents the number of outputs, so that the ratio k/n is the rate of the encoder. The ratio k/n is always lower than or equal to 1.

Within the preferred embodiment the post-processing element is a non-recursive encoder having generator polynomials:

$$G_{NR}(D) = \begin{bmatrix} g_{1,0} & 0 & \cdots & 0 & 0 \\ 0 & g_{2,0} & 0 & 0 & 0 \\ \vdots & 0 & \ddots & 0 & \vdots \\ 0 & 0 & 0 & g_{k-1,0} & 0 \\ 0 & 0 & \cdots & 0 & g_{k,0} \end{bmatrix}.$$

Such an arrangement is applicable to hard decision symbols, and having the post-processing as such a non-recursive encoding operation ensures that as accurate a decoding as possible is obtained.

From a second aspect there is provided an apparatus for decoding a recursive convolutional encoded bitstream, comprising: a pre-processing element arranged to receive the recursive convolutional encoded bitstream and to apply a pre-processing operation thereto; and a decoder adapted to decode a non-recursive convolutional encoded bitstream; the pre-processing element and the decoder operable together in turn to decode a received recursive convolutional encoded bitstream to provide a decoded bitstream.

The advantage of the invention of the second aspect is the same as that of the first aspect in that the same decoder can be used to decode both non-recursive convolutional codes and, with the pre-processing element, recursive convolutional codes. It is therefore no longer necessary to provide a separate dedicated decoder for both recursive and non-recursive codes.

In an embodiment of the second aspect the at least one pre-processing element receives the recursive convolutional encoded bitstream, and applies a pre-processing operation thereto to provide an intermediately decoded bitstream; and wherein the decoder receives the intermediately decoded bitstream, and completes the decoding to provide the decoded bitstream. Preferably there is provided a plurality of pre-processing elements, being one for each coded output bitstream from a target recursive convolutional encoder which produced the recursive convolutional encoded bitstream, the outputs of each pre-processing element being fed to said decoder as inputs. However, as described in the embodiments, the plurality of pre-processing elements can together be considered to be a single pre-processing element having a combined operation. The alternative embodiment can be readily implemented in software, where the pre-processing element can be represented by a single look-up table.

Preferably in the embodiment according to the second aspect, the recursive convolutional encoded bitstream has been encoded by a recursive convolutional encoder having generator polynomials $$G_{RCE}(D) = \begin{bmatrix} \frac{g_{1,1}}{g_{1,0}} & \cdots & \cdots & \cdots & \frac{g_{1,n}}{g_{1,0}} \\ \vdots & \ddots & & & \vdots \\ \vdots & & \ddots & & \vdots \\ \vdots & & & \ddots & \vdots \\ \frac{g_{k,1}}{g_{1,0}} & \cdots & \cdots & \cdots & \frac{g_{k,n}}{g_{1,0}} \end{bmatrix} ; \text{ and}$$

the decoder is adapted to decode a non-recursive convolutional encoded bitstream produced by a non-recursive convolutional encoder having generator $$\text{polynomials } G_{NRCE}(D) = \begin{bmatrix} g_{1,1} & \cdots & \cdots & \cdots & g_{1,n} \\ \vdots & \ddots & & & \vdots \\ \vdots & & \ddots & & \vdots \\ \vdots & & & \ddots & \vdots \\ g_{k,1} & \cdots & \cdots & \cdots & g_{k,n} \end{bmatrix}$$

where k is greater than or equal to 1, and n is greater than or equal to k. In this case, as in the first aspect, k represents the number of inputs to the encoder, and n represents the number of outputs, so that the ratio k/n is the rate of the encoder.

In one embodiment of the second aspect the pre-processing element is a non-recursive encoder having a generator matrix of n columns and n rows of the form:

$$G_{NR}(D) = \begin{bmatrix} g_{1,0} & 0 & \cdots & 0 & 0 \\ 0 & g_{1,0} & 0 & 0 & 0 \\ \vdots & 0 & \ddots & 0 & \vdots \\ 0 & 0 & 0 & g_{1,0} & 0 \\ 0 & 0 & \cdots & 0 & g_{1,0} \end{bmatrix}.$$

Such an arrangement is particularly adapted to operate on hard decision symbols, and ensures that as accurate a decoding as possible is obtained. Note that in this embodiment of the second aspect the recursive encoded bitstream has been generated by a recursive encoder having identical feedback polynomials to each input, and hence the generator polynomials of the non-recursive encoder used as the pre-processing element are identical.

In alternative embodiments the recursively encoded bitstream is represented by soft-decision symbols. Within such embodiments the pre-processing element or post-processing element, as appropriate, comprises an input for receiving a soft decision bitstream $\alpha_n$, at least one symbol delay for producing at least one delayed soft decision bitstream $\alpha_{n-k}$, and at least one summer, wherein the or each summer is arranged to output an output according to the following:

$$\sum (\alpha_n, \alpha_{n-k}) = \ln\left[\frac{1 + e^{\alpha_n + \alpha_{n-k}}}{e^{\alpha_n} + e^{\alpha_{n-k}}}\right].$$

Note: rather than nesting several Σ operators with 2 inputs, we can also use one, or combinations of generalised Σ operators with p inputs:

$$\sum (\alpha_{n-k_1}, \alpha_{n-k_2}, \ldots, \alpha_{n-k_p}) = 2 \cdot ar\tanh\left[\prod_{i=1}^{p} \tanh(\alpha_{n-k_i}/2)\right]$$

The advantages of such embodiments are that soft decision symbol representations can be used, leading to a more accurate and reliable decoding.

In alternative soft decision embodiments the pre-processing element or post-processing element, as appropriate, comprises an input for receiving a soft decision bitstream $\alpha_n$, at least one symbol delay for producing at least one delayed soft decision bitstream $\alpha_{n-k}$, and at least one summer, wherein the or each summer is arranged to output an output according to the following:

$$\sum (\alpha_{n-k_1}, \alpha_{n-k_2}, \ldots, \alpha_{n-k_p}) \approx \left[\prod_{i=1}^{p} \text{sgn}(\alpha_{n-k_i})\right] \cdot \min_{1 \leq i \leq p} |\alpha_{n-k_i}|$$

Note that there are p inputs, where the first delay $k_1$ is possibly 0 so that $\alpha(n-k_1)$ is possibly $\alpha(n)$.

Such embodiments provide the further advantage that the Sigma function is much reduced in complexity, leading to easier implementation, either in hardware or software.

Within the embodiments the decoder is preferably one selected from the group comprising: a sequential decoder; and a maximum likelihood decoder. More particularly, where the decoder is a sequential decoder then the decoder is preferably a Fano decoder. Alternatively, where the decoder is a maximum likelihood decoder then the decoder is preferably a Viterbi decoder. Use of the Fano decoder or the Viterbi decoder is advantageous as both are mature technologies which are well understood with predictable behaviours. Other decoder arrangements (Log-MAP, MAP etc.) are also known in the art, any of which may be used.

From a third aspect the invention also provides a method for decoding a recursive convolutional encoded bitstream, comprising applying a decoding operation to the recursive convolutional encoded bitstream, followed by a post-processing operation, wherein the decoding operation is arranged to decode a non-recursive convolutional encoded bitstream; the decoding operation and the post-processing operation operable together in turn to decode the received recursive convolutional encoded bitstream to provide a decoded bitstream. The same advantages as described previously in respect of the first aspect are obtained.

Preferably, within embodiments of the third aspect the recursive convolutional encoded bitstream has been encoded by a recursive convolutional encoder having generator $$\text{polynomials } G_{RCE}(D) = \begin{bmatrix} \frac{g_{1,1}}{g_{1,0}} & \cdots & \cdots & \cdots & \frac{g_{1,n}}{g_{1,0}} \\ \vdots & \ddots & & & \vdots \\ \vdots & & \ddots & & \vdots \\ \vdots & & & \ddots & \vdots \\ \frac{g_{k,1}}{g_{k,0}} & \cdots & \cdots & \cdots & \frac{g_{k,n}}{g_{k,0}} \end{bmatrix}; \text{ and}$$

the decoding operation is adapted to decode a non-recursive convolutional encoded bitstream produced by a non-recursive convolutional encoder having generator $$\text{polynomials } G_{NRCE}(D) = \begin{bmatrix} g_{1,1} & \cdots & \cdots & \cdots & g_{1,n} \\ \vdots & \ddots & & & \vdots \\ \vdots & & \ddots & & \vdots \\ \vdots & & & \ddots & \vdots \\ g_{k,1} & \cdots & \cdots & \cdots & g_{k,n} \end{bmatrix}.$$

where k is greater than or equal to 1, and n is greater than or equal to k In this case, as in the first aspect, k represents the number of inputs to the encoder, and n represents the number of outputs, so that the ratio k/n is the rate of the encoder.

In the particularly preferred embodiments the post-processing operation is a non-recursive encoding operation having generator polynomials:

$$G_{NR}(D) = \begin{bmatrix} g_{1,0} & 0 & \cdots & 0 & 0 \\ 0 & g_{2,0} & 0 & 0 & 0 \\ \vdots & 0 & \ddots & 0 & \vdots \\ 0 & 0 & 0 & g_{k-1,0} & 0 \\ 0 & 0 & \cdots & 0 & g_{k,0} \end{bmatrix}.$$

This ensures that as accurate a decoding as possible is obtained. Such an arrangement is particularly suitable for hard decision symbols.

From a fourth aspect the invention also provides a method for decoding a recursive convolutional encoded bitstream, comprising a pre-processing operation arranged to receive the recursive convolutional encoded bitstream and to apply a pre-processing operation thereto followed by a decoding operation, the decoding operation adapted to decode a non-recursive convolutional encoded bitstream; wherein the pre-processing operation and the decoding operation are operable together in turn to decode the received recursive convolutional encoded bitstream to provide a decoded bitstream. The same advantages as previously described in respect of the second aspect are obtained.

Within embodiments of the fourth aspect, the recursive convolutional encoded bitstream has preferably been encoded by a recursive convolutional encoder having generator $$\text{polynomials } G(D) = \begin{bmatrix} \frac{g_{1,1}}{g_{1,0}} & \cdots & \cdots & \cdots & \frac{g_{1,n}}{g_{1,0}} \\ \vdots & \ddots & & & \vdots \\ \vdots & & \ddots & & \vdots \\ \vdots & & & \ddots & \vdots \\ \frac{g_{k,1}}{g_{1,0}} & \cdots & \cdots & \cdots & \frac{g_{k,n}}{g_{1,0}} \end{bmatrix}; \text{ and}$$

the decoding operation is adapted to decode a non-recursive convolutional encoded bitstream produced by a non-recursive convolutional encoder having generator $$\text{polynomials } G(D) = \begin{bmatrix} g_{1,1} & \cdots & \cdots & \cdots & g_{1,n} \\ \vdots & \ddots & & & \vdots \\ \vdots & & \ddots & & \vdots \\ \vdots & & & \ddots & \vdots \\ g_{k,1} & \cdots & \cdots & \cdots & g_{k,n} \end{bmatrix}$$

where k is greater than or equal to 1, and n is greater than or equal to k. Thus, it will be seen that in embodiments of the fourth aspect the feedback polynomials of the target recursive encoder are identical to each other.

In preferred embodiments of the fourth aspect the pre-processing operation is a non-recursive encoding having generator matrix of n columns and n rows of the form:

$$G_{NR}(D) = \begin{bmatrix} g_{1,0} & 0 & \cdots & 0 & 0 \\ 0 & g_{1,0} & 0 & 0 & 0 \\ \vdots & 0 & \ddots & 0 & \vdots \\ 0 & 0 & 0 & g_{1,0} & 0 \\ 0 & 0 & \cdots & 0 & g_{1,0} \end{bmatrix}.$$

Such operation ensures as accurate a decoding as possible. Moreover, the non-recursive encoding operation is particularly suitable for use with hard-decision input symbols.

In other embodiments of the third or fourth aspects the recursively encoded bitstream is represented by soft-decision symbols. This allows for the additional accuracy and reliability of soft decision systems to be obtained.

In one soft decision embodiment the pre-processing operation or post-processing operation, as appropriate, comprises receiving a soft decision bitstream $\alpha_n$, delaying the received soft decision bitstream to produce at least one delayed soft decision bitstream $\alpha_{n-k}$, and summing the soft decision bitstream and the at least one delayed soft decision bitstream according to the following:

$$\sum (\alpha_n, \alpha_{n-k}) = \ln\left[\frac{1 + e^{\alpha_n + \alpha_{n-k}}}{e^{\alpha_n} + e^{\alpha_{n-k}}}\right]$$

Or more generally:

$$\sum (\alpha_{n-k_1}, \alpha_{n-k_2}, \ldots, \alpha_{n-k_p}) = 2 \cdot \text{artanh}\left[\prod_{i=1}^{p} \tanh(\alpha_{n-k_i}/2)\right]$$

to produce an output soft decision bitstream.

In another soft decision embodiment the pre-processing operation or post-processing operation, as appropriate, comprises receiving a soft decision bitstream $\alpha_n$, delaying the received soft decision bitstream to produce at least one delayed soft decision bitstream $\alpha_{n-k}$, and processing the soft decision bitstream and the at least one delayed soft decision bitstream according to the following:

$$\Sigma(\alpha_{n-k_1}, \alpha_{n-k_2}, \ldots, \alpha_{n-k_p}) \approx \left[\prod_{i=1}^{p} \text{sgn}(\alpha_{n-k_i})\right] \cdot \min_{1 \leq i \leq p} |\alpha_{n-k_i}|$$

to produce an output soft decision bitstream. This latter embodiment has additional advantages in that the approximation for the sigma function leads to reduced implementation complexity, whether implemented in hardware or software.

Preferably the decoding step is one selected from the group comprising: a sequential decoding; and a maximum likelihood decoding. More preferably, where the decoding is a sequential decoding then the decoding preferably uses a Fano algorithm. Similarly, where the decoding is a maximum likelihood decoding then the decoding preferably uses a Viterbi algorithm. Other known decoding algorithms (e.g. MAP, Log-MAP etc.) may also be used.

From a fifth aspect there is provided a software program or suite of software programs arranged such that when run on a processing device they cause the processing device to operate in accordance with the third or fourth aspect described above. Moreover, from a sixth aspect, there is also provided a computer readable storage medium storing a software program or at least one of the suite of software programs according to the fifth aspect. The computer readable storage medium may be any such medium known in the art, such as disk based media such as a hard disk, CD, DVD, or the like, or solid state media such as Flash memory.

Further features and advantages of the invention will be apparent from the appended claims.

BRIEF DESCRIPTION OF THE DRAWINGS

Further features and advantages of the present invention will become apparent from the following description of embodiments thereof, presented by way of example only, and by reference to the accompanying drawings, wherein like reference numerals refer to like parts, and wherein:—

FIG. 26 is a diagram illustrating how hard decision and soft decision elements can be combined to provide further pre-processing embodiments of the invention.

DESCRIPTION OF THE EMBODIMENTS

Figure 1:
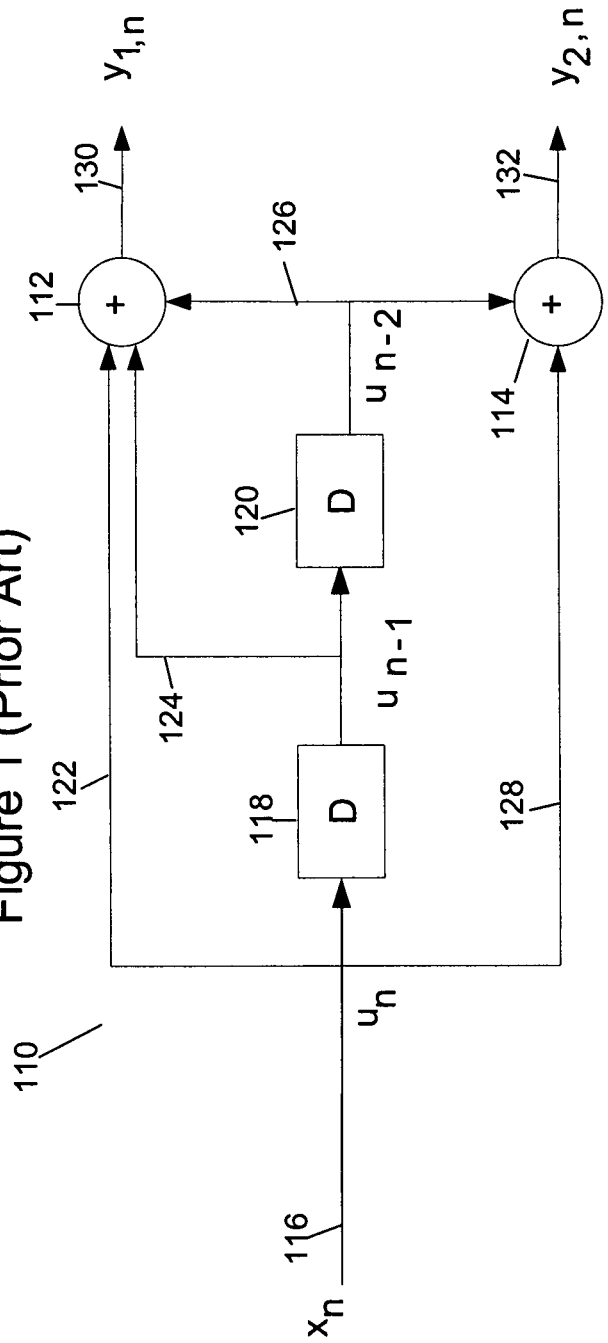
FIG. 1 is a block diagram illustrating a rate 1/2 non-recursive convolutional encoder of the prior art.
Figure 2:
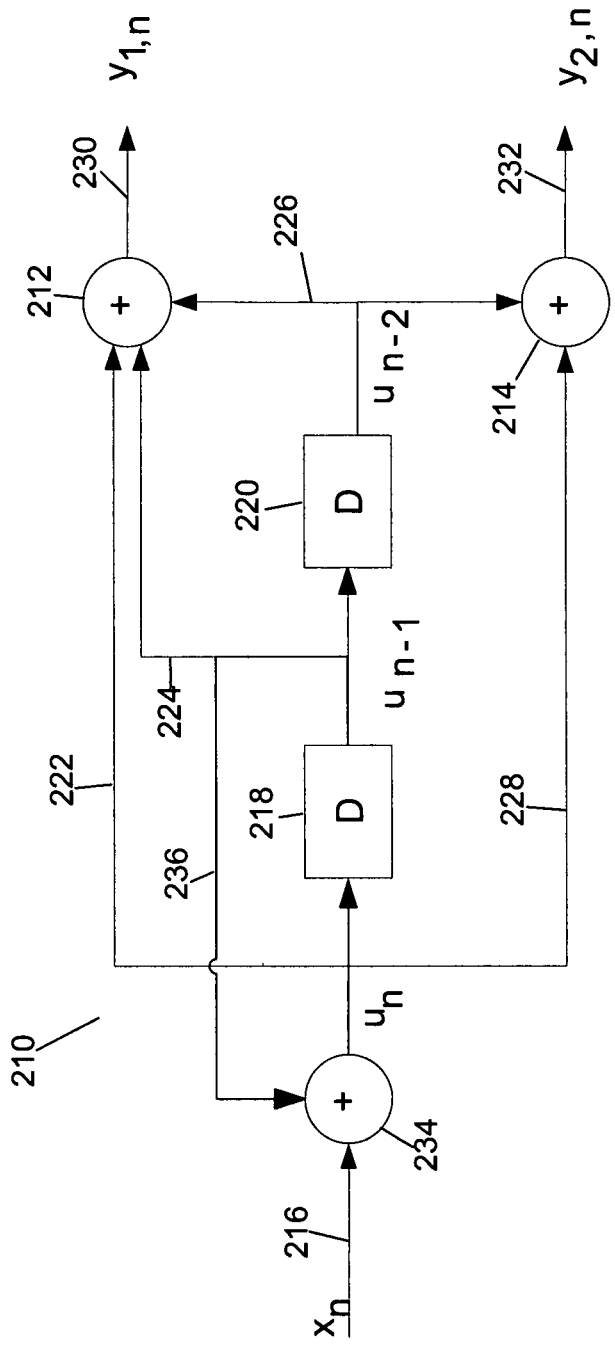
FIG. 2 is a block diagram illustrating a rate 1/2 recursive convolutional encoder of the prior art.

Before describing the structure and operation of a first embodiment of the present invention, first consider again the recursive convolutional encoder 210 shown in FIG. 2. When comparing the recursive encoder 210 with the non-recursive encoder 110 of FIG. 1, it will be seen that the only difference between the two encoders is the provision of the feedback line 236, and the first modulo-2 adder 234. Moreover, as shown in FIGS. 1 and 2, the generator polynomials g1 and g2 are identical. The recursive encoder then adds in the additional generator polynomial g0, as part of the feedback loop.

Figure 4:
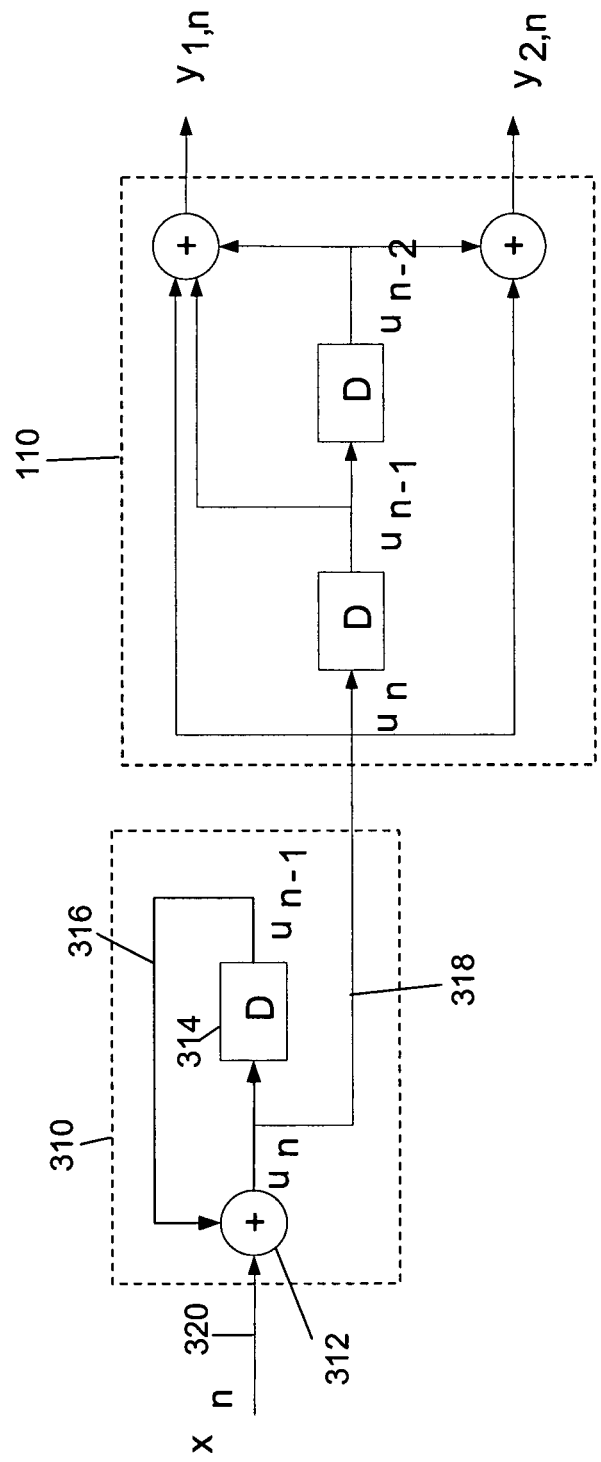
FIG. 4 is a block diagram illustrating both non-recursive and recursive convolutional encoders for use in explaining the first embodiment of the invention.

When one considers the recursive convolutional encoder with respect to the non-recursive convolutional encoder as set out above, it becomes apparent that the recursive encoder can be thought of as having a (virtual) recursive part, and a (virtual) non-recursive part. FIG. 4 illustrates such a representation of the recursive encoder, provided with a recursive part 310, and a non-recursive part 110. As will be seen, the non-recursive part 110 is identical to the non-recursive encoder 110 of FIG. 1. The recursive part 310 comprises an input line 320 receiving the input bitstream $x_n$ to be coded, which is input into a first modulo-2 adder 312. A single delay 314 is provided, the output bit of which, $u_{n-1}$ is fed back via line 316 to a second input of the modulo-2 adder 312. The output of the modulo-2 adder is then both input into the delay 314, and output to the non-recursive part of the encoder 110, as an input thereto, on output line 318. The recursive part of the encoder therefore represents a rate 1/1 recursive encoder, having generator matrix:

$G=(1/g0)$, where $g0(D)=1+D$

The output bitstream from the recursive part, output on line 318 to the non-recursive part 110 can therefore be thought of as a recursively convolutionally encoded bitstream, encoded at rate 1/1 i.e. one output bit for every input bit. This is then fed into the rate 1/2 non-recursive convolutional encoder part 110.

When considering the recursive convolutional encoder as having a (virtual) recursive part and a non-recursive part as set out in FIG. 4, the present inventor realised that in order to decode a bitstream encoded by a recursive encoder a multiple step decoding operation could be performed which essentially reversed the above described (virtual) stages of the coding. That is, if, as shown in FIG. 4, a recursive encoder can be virtually represented as having a recursive encoding stage, and a non-recursive encoding stage, then to decode the encoded bitstream from such an arrangement one can apply appropriate decoding stages i.e. a decoding stage to decode the non-recursive encoding, and a decoding stage to decode the recursive encoding. Embodiments of the invention are based on this realisation.

Figure 5:
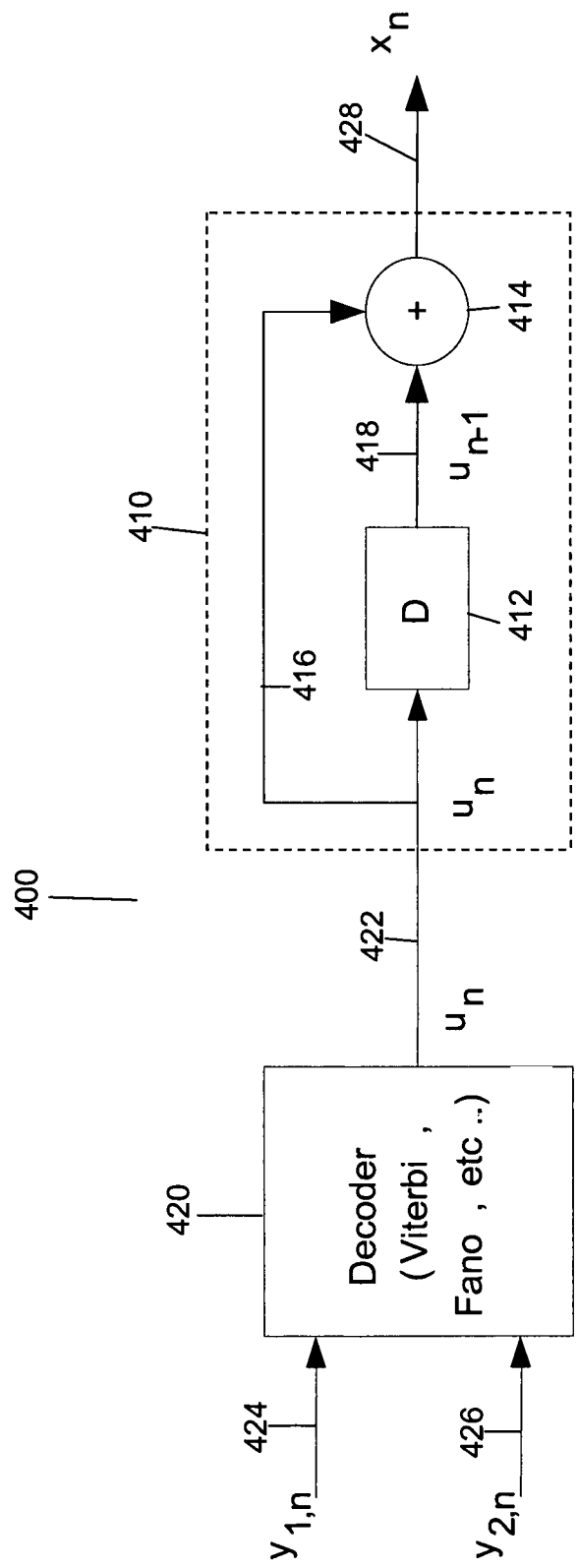
FIG. 5 is a block diagram illustrating a first embodiment of the present invention.

With reference to FIG. 5, therefore, a decoding arrangement 400 according to a first embodiment of the present invention will now be described.

More particularly, the decoding arrangement 400 of the first embodiment comprises a first decoding part 420, and a second decoding part 410. The first decoding part 420 is a conventional convolutional decoder, which is adapted to decode a bitstream which has been encoded by a non-recursive convolutional encoder of known generator polynomials. More particularly, the decoder 420 is adapted to decode a bitstream which has been encoded by a non-recursive encoder having the same characteristics and generator polynomials as the (virtual) non-recursive part of the target recursive convolutional encoder which the decoding arrangement 400 is intended to be able to decode. Therefore, the decoder 420 has two input lines 424 and 426, to receive the two streams of coded output bits. Where the output bits from the encoder have been interleaved into a single bitstream for transmission, these bits are de-interleaved into the individual coded output streams $y_{1,n}$ and $y_{2,n}$ prior to being input into the decoder 420. In other embodiments described later, such de-interleaving is not required.

The operation of the decoder 420 is conventional, and will not be described herein. The operation of various types of convolutional decoders is well known in the art. For example, the tutorial available at the following URL: http://www.complextoreal.com/chapters/convo.pdf, which is incorporated herein by reference, provides further explanation, if required.

The conventional decoder 420 may use any decoding algorithm already known in the art, such as, for example, a sequential decoding process, or a maximum likelihood decoding process. Where a sequential decoding process is used, preferably the Fano algorithm is used. Where a maximum likelihood decoding process is used, preferably the Viterbi algorithm is used. Both of these algorithms are well known in the art.

The decoder 420 in the first embodiment is preferably a hard decision output decoder, in that it outputs, for each pair of coded input bits, a single output bit (as opposed to a soft decision decoder, which may output a series of probabilities). Embodiments utilising soft-decision inputs/soft decision output decoders will be described later. The output bit $u_n$ from the decoder 420 is input on input line 422 to the second decoding stage 410, which in this case is a post processing stage in the form of a non-recursive convolutional encoder. More particularly, the second decoding stage 410 comprises a non-recursive convolutional encoder having a delay 412, and a single modulo-2 adder 414. The bitstream $u_n$ output from the conventional decoder 420 on line 422 is input into the non-recursive encoder 410, and fed to the delay 412. Additionally, the input is also fed via line 416 to a first input of the modulo-2 adder 414. A second input of the modulo-2 adder accepts, on line 418, the output of the delay 412 i.e. the delay bit $u_{n-1}$, delayed by 1 bit period. The modulo-2 adder 414 outputs the decoded bitstream $x_n$ on output line 428.

Thus, the second decoding part 410 can be considered, as mentioned, a non-recursive convolutional encoder, but having rate 1/1 i.e. 1 bit is output for every bit which is input. Moreover, as will be seen from FIG. 5, the generator polynomial for the non-recursive encoder 410 is defined by the generator polynomial of the recursive part of the target recursive encoder which the decoding arrangement 400 is intending to decode. That is, with reference to FIG. 4, given that the generator matrix for the recursive part of the recursive encoder was:

$$G = \left(\frac{1}{g0}\right), \text{ where } g0 = 1 + D$$

then the generator matrix for the non-recursive encoder 410 is given by:—

$G=(g0)$, where $g0=1+D$.

The effect of this non-recursive encoding in accordance with the generator polynomial given above, which is the same as the feedback generator polynomial of the recursive encoder, is that the decoding of the input bitstreams is completed, and the output decoded bitstream $x_n$ should then be the same as the original input bitstream $x_n$ input into the recursive convolutional encoder.

Therefore, according to the first embodiment, instead of providing a dedicated conventional decoder 420 for the target recursive encoder which it is intended to decode, an existing decoder 420 which can also be used to decode non-recursively encoded bitstreams is used, in combination with the rate 1/1 non-recursive encoder 410, which is extremely easy to implement. Thus, where, for example, the decoders are being implemented on an integrated circuit which is required to decode both recursive and non-recursively coded signals, then a single conventional decoder 420 can be provided which can be used to decode both non-recursively encoded bitstreams, as well as, at least partially, the recursively encoded bitstreams, and then the simple rate 1/1 non-recursive encoder can be further provided to complete the decoding of the partially decoded recursively coded bitstreams. In this respect; the complexity, and hence silicon area on the IC which the module will occupy, of the rate 1/1 non-recursive encoder 410 is much reduced when compared to a dedicated conventional decoder 420 for the recursive codes, which would otherwise be required.

Figure 6:
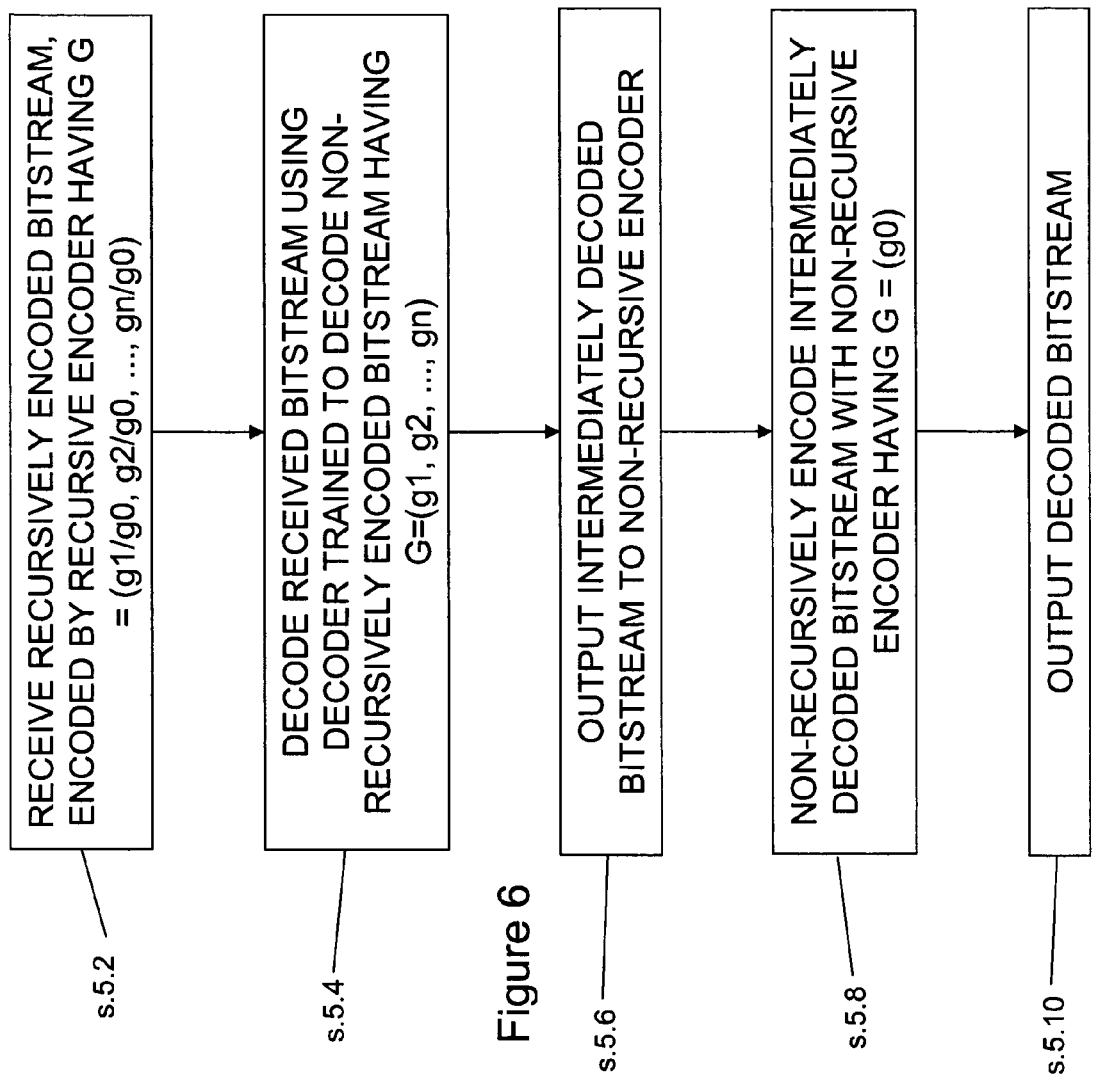
FIG. 6 is a flow diagram illustrating the steps performed according to a method of the first embodiment of the invention.

FIG. 6 illustrates the process steps performed by the decoder arrangement 400. Firstly, at step 5.2 the conventional decoder 420 receives the recursively encoded bitstream, which has been encoded by a recursive encoder having the generator matrix:—

$$G = \left(\frac{g1}{g0}, \frac{g2}{g0}, \cdots, \frac{gn}{g0}\right).$$

In this respect, the conventional decoder has been adapted to decode a bitstream encoded by a non-recursive encoder having generator matrix: G=(g1, g2, ..., gn). Thus, at step 5.4 the decoder 420 decodes the received coded bitstreams, to provide an intermediately decoded bitstream which is output, at step 5.6.

At step 5.8 the intermediately decoded bitstream is received by the non-recursive encoder 410, which, as discussed, has generator matrix:

G=(g0)

The non-recursive encoder 410 then non-recursively encodes the intermediately decoded bitstream, to provide a completely decoded bitstream $x_n$ at its output line 428, at step 5.10. Thus, through a combination of decoding using a decoder which is adapted to decode a non-recursive code, followed by a post processing stage which is a non-recursive encoding with rate 1/1, a recursively coded bitstream can be completely decoded.

A second embodiment of the invention will now be described with respect to FIGS. 7 to 7.

Figure 7:
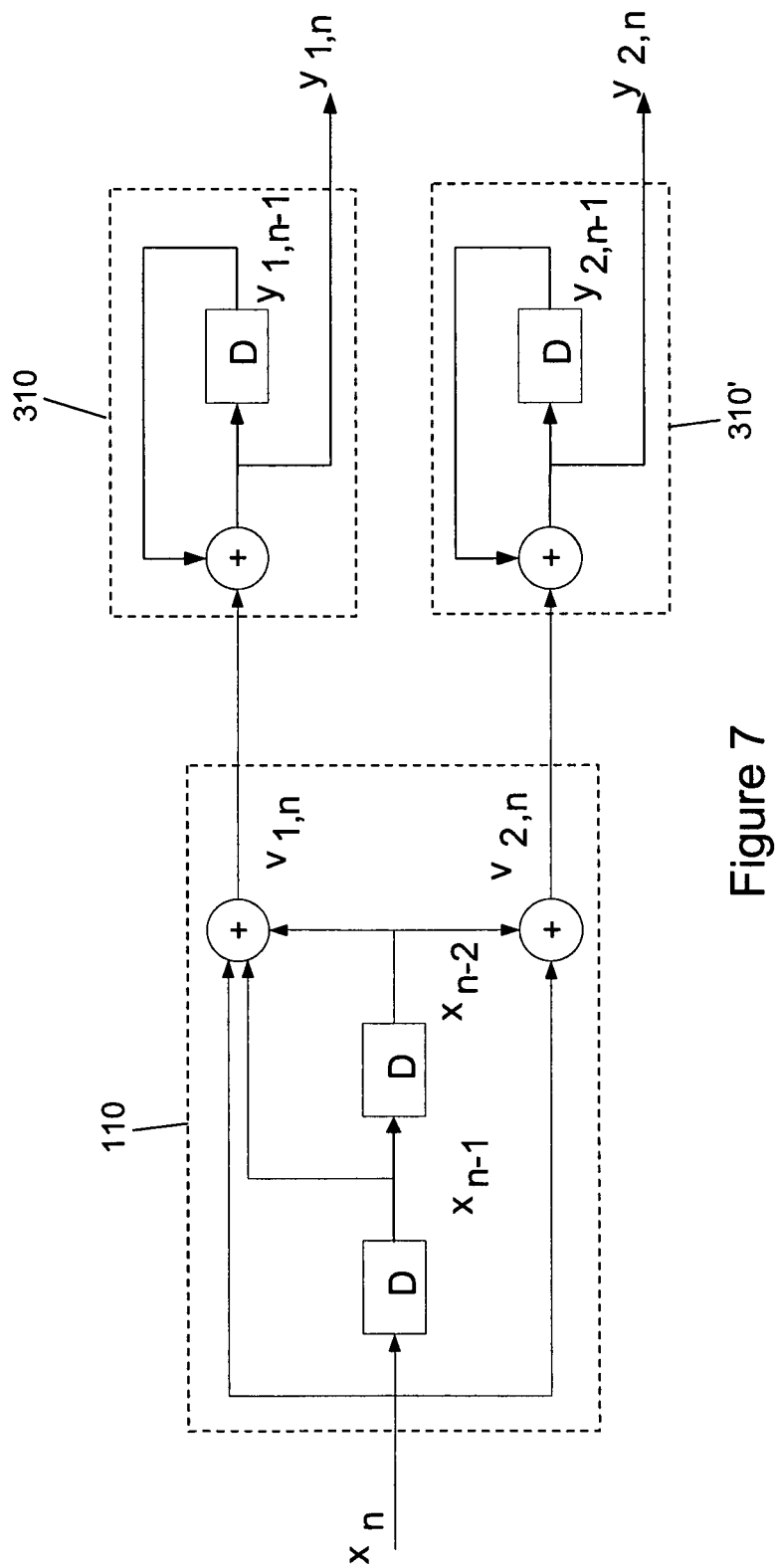
FIG. 7 is a block diagram illustrating both recursive and non-recursive convolutional encoders for the purposes of describing a second embodiment of the invention.

FIG. 7 shows a second (virtual) representation, of the recursive encoder 210 of FIG. 2. When compared with FIG. 4, it will be seen that in FIG. 7, instead of the recursive encoder being represented by a recursive encoding followed by a non-recursive encoding, instead it is the other way round. In particular, here the input bitstream $x_n$ is first non-recursively encoded by a non-recursive encoder 110, and then both of the outputs of the non-recursive encoder 110 are individually recursively encoded by respective recursive encoders 310 and 310'. The effect is the same i.e. that the input bitstream is recursively encoded. The generator polynomials of the non-recursive encoder 110, and the recursive encoders 310 and 310' are the same as previously.

Figure 8:
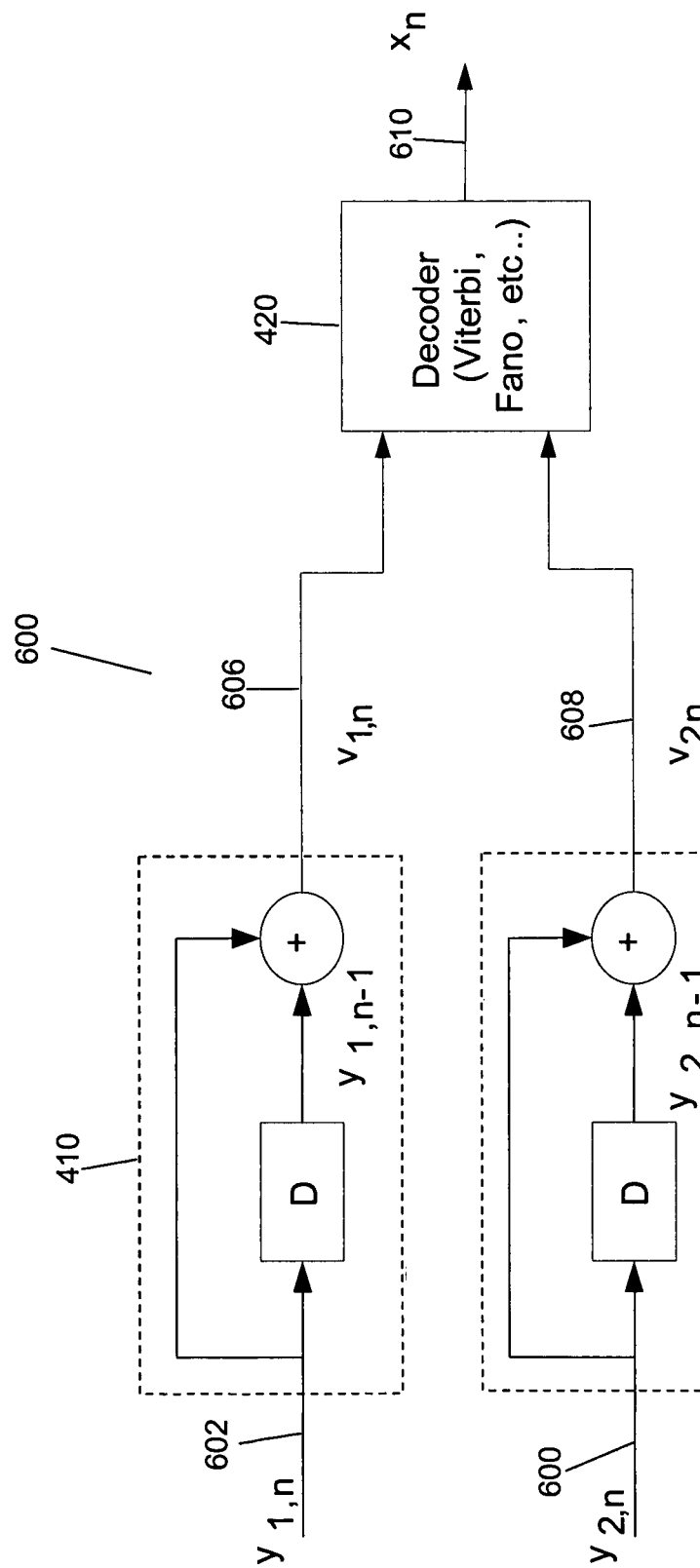
FIG. 8 is a block diagram of a second embodiment of the invention.

Based upon the inventor's realisation that a recursive encoder can also be modelled as shown in FIG. 7, a second decoder arrangement 600 according to a second embodiment of the invention is further provided. More particularly, when comparing the second decoding arrangement 600 of FIG. 8 with the first decoding arrangement 400 of FIG. 5, it can be seen that the elements are reversed in order i.e. the coded bitstreams are first subject to a rate 1/1 non-recursive encoding, and are then input into the conventional decoder 420.

More particularly, the second decoding arrangement 600 according to the second embodiment comprises two input lines 602 and 600, on which are received the two coded output streams $y_{1,n}$ and $y_{2,n}$ from the encoder. As in the first embodiment, if the two coded output streams have been interleaved into a single stream for transmission, then the streams are de-interleaved prior to being input into the second decoder arrangement 600 of FIG. 8. Each coded input stream 602 or 600 is input into a respective non-recursive convolutional encoder 410 or 410', having the same structure and operation as the non-recursive convolutional encoder 410 of the first embodiment. That is, the generator polynomial g0 of the non-recursive convolutional encoder corresponds to the feedback polynomial of the target recursive encoder which it is intended to decode. The two non-recursive encoders 410 and 410' generate two intermediately decoded output streams $v_{1,n}$, on line 606 and $v_{2,n}$ on line 608. These are then input into the conventional decoder 420, which is adapted to decode a bitstream encoded by a non-recursive encoder having generator polynomials in accordance with the (virtual) non-recursive part of the target recursive encoder. As in the first embodiment, the decoder 420 may be any of a sequential decoder, such as a Fano decoder, or a maximum likelihood decoder, such as a Viterbi decoder, as are well known in the art. The decoder 420 outputs the decoded bitstream $x_n$, on output line 610.

Figure 9:
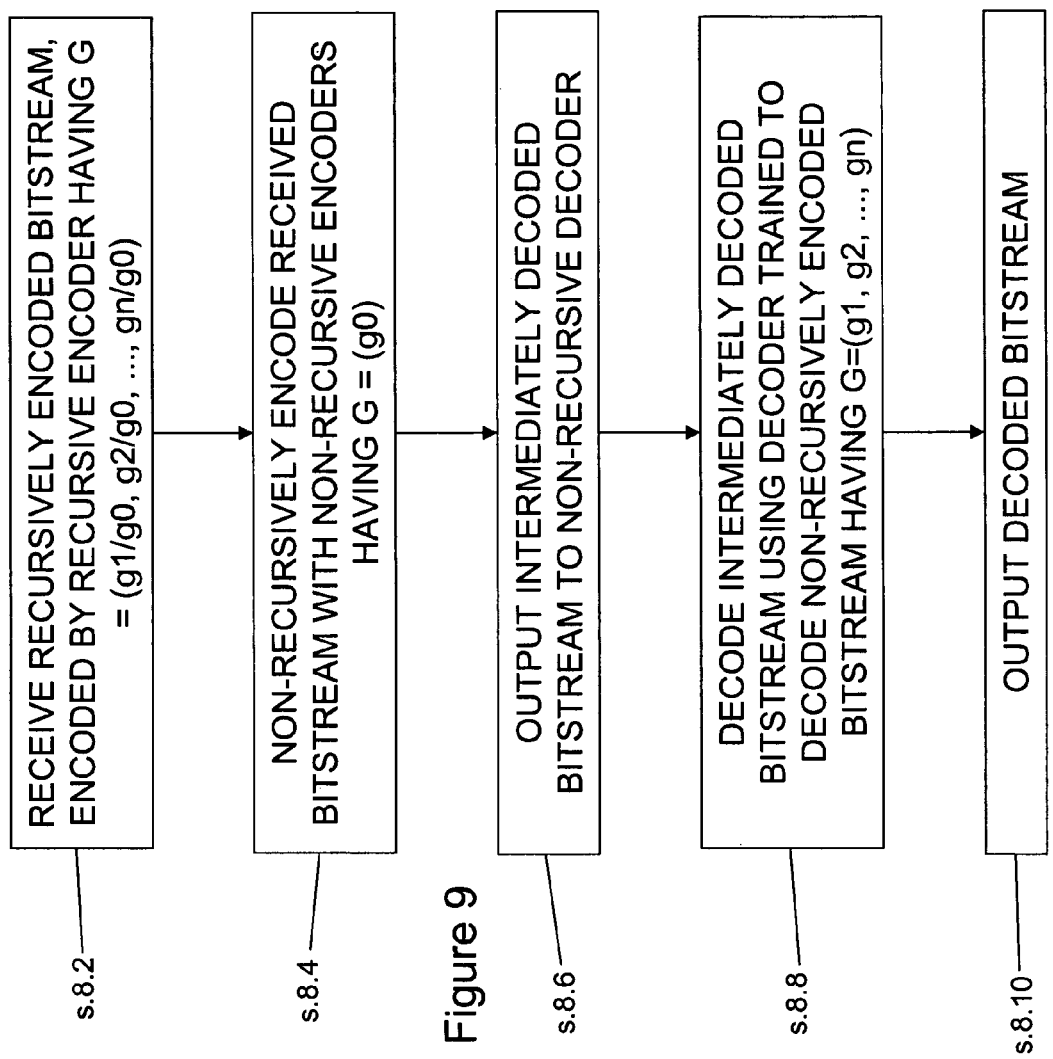
FIG. 9 is a flow diagram illustrating the method performed by the second embodiment of the invention.

FIG. 9 illustrates the method performed by the second decoder arrangement 600 of the second embodiment. More particularly, at step 8.2 the recursively encoded bitstream is received, and subsequently at step 8.4 the individual coded bitstreams are non-recursively encoded with the non-recursive encoders 410 and 410' to produce intermediately decoded bitstreams. At step 8.6 the intermediately decoded bitstreams are then input to the non-recursive decoder 420 which, at step 8.8 then decodes the intermediately decoded bitstream to produce the completely decoded bitstream $x_n$. The decoded bitstream is then output at step 8.10.

The second decoder arrangement 600 according to the second embodiment is less preferable than the first decoder arrangement 400 according to the first embodiment when being implemented in hardware, as multiple non-recursive encoders 410 are required, for each coded bitstream. Where the number of output bits in the coded bitstream is high (e.g. code rates as low as 1/100 are known for deep space applications) then the second decoder arrangement becomes less practical due to the number of non-recursive encoders 410 which are required. Nevertheless, where the number of non-recursive encoders 410 remains a manageable number, then advantages are still provided by the second embodiment when compared to the alternative of providing separate conventional decoders for both the recursive and non-recursive codes.

However, in alternative embodiments implemented in software rather than hardware, the non-recursive encoder 410 can be implemented as a mere look-up table, thus further reducing the complexity of the arrangement. The implementation of non-recursive convolutional encoders as look-up tables is well known in the art. However, in the context of the present embodiments, implementation in software using a look-up table for the non-recursive encoder 410 is advantageous for the second embodiment described above, as the same look-up table can be used for each of the non-recursive encoders 410, 410' etc. required, with multiple look-up calls being made to the table for each encoder. Thus, for a software implementation of the second embodiment, the disadvantages described above are no longer relevant. Moreover, a further embodiment which does not require de-interleaving of the input coded bitstream and which is described next can also help to alleviate this issue.

As noted above, one of the problems with the second embodiment is that a separate non-recursive encoder 410 is required for each input bit in the coded bitstream i.e. where the bitstream has been coded with a rate k/n encoder, then n non-recursive encoders are required, and the input bitstream is deinterleaved into the separate encoded bitstreams each of which is respectively input into one of the non-recursive encoders. However, within a third embodiment of the invention shown in FIGS. 10 and 11, this requirement is done away with, and the interleaved coded bitstream can remain interleaved, being input into a single non-recursive encoder.

Figure 10:
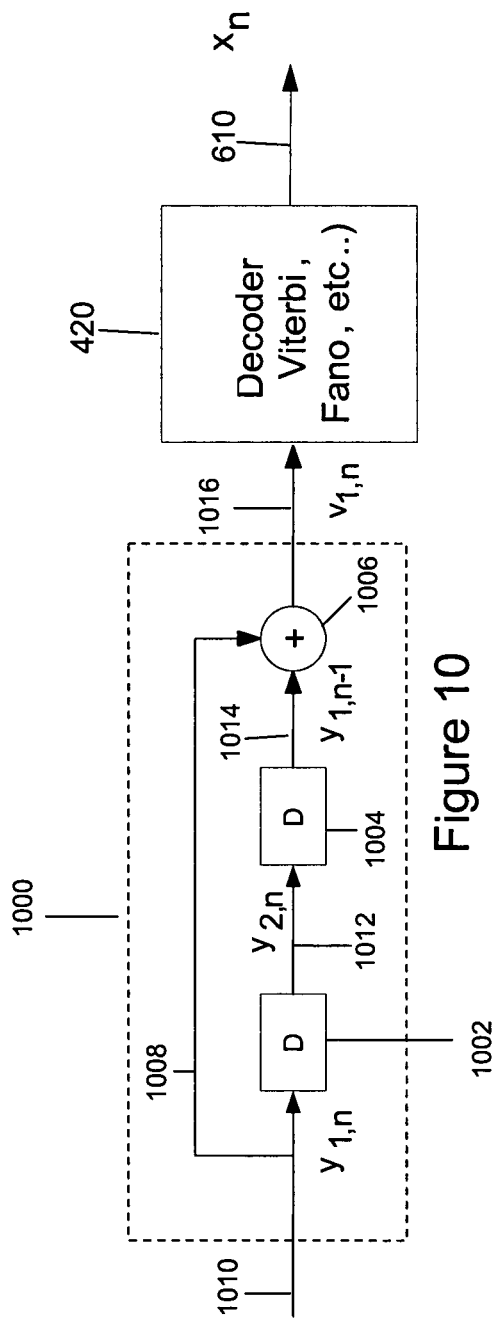
FIG. 10 is a block diagram of a third embodiment of the invention.

More particularly, as shown in FIG. 10 an input line 1010 receives the interleaved bitstream, incorporating in this example separate coded streams $y_1$ and $y_2$. That is, input line 1010 receives a bitstream $y_{2,n}, y_{1,n}, y_{2,n+1}, y_{1,n+1}$, etc. etc. The input line 1010 inputs the received bitstream into a non-recursive encoder 1000, which comprises two one bit delays 1002 and 1004 arranged in sequence, the output of the second one bit delay 1004 being input into a modulo-2 adder 1006. A feed forward line 1008 connects the input 1010 to the modulo-2 adder 1006. The output of the modulo-2 adder 1006 is output on line 1016 as intermediately decoded bitstream $v_{1,n}, v_{2,n}$, etc. etc. to the conventional decoder 420. As in the previous embodiments, the conventional decoder 420 is adapted to decode a bitstream which has been non-recursively encoded by an encoder having a set of generator polynomials G, which is known. The conventional decoder 420 completes the decoding, and outputs a decoded bitstream $x_n$ on line 610. Generally, therefore, apart from the operation of the non-recursive encoder 1000, the remainder of the operation of the third embodiment is identical to that of the second embodiment.

Figure 11:
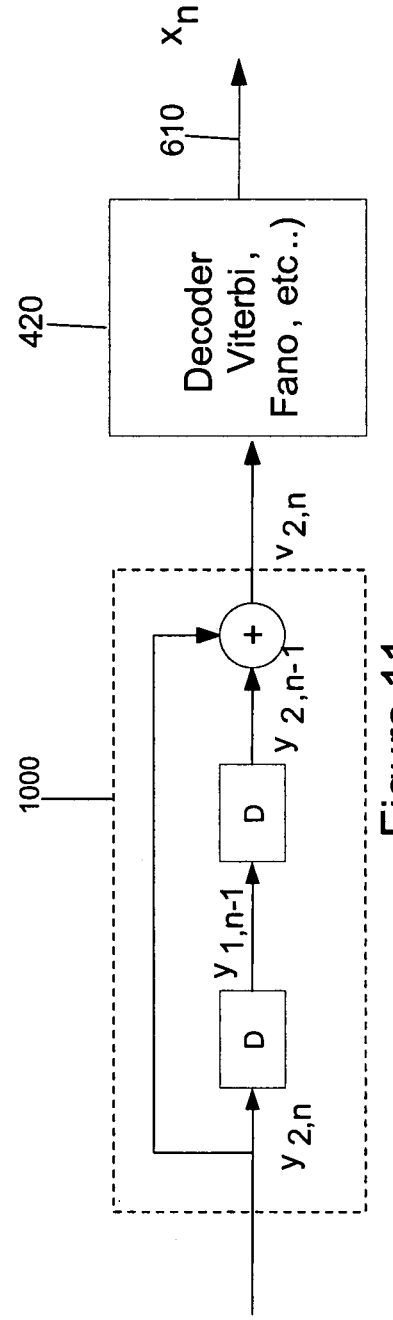
FIG. 11 is another block diagram of the third embodiment of the invention.

Returning to the non-recursive encoder 1000, FIG. 10 illustrates the "state" bits within the encoder on an "odd" iteration i.e. when $y_{1,n}$ is the current input bit, whereas FIG. 11 shows the state bits on an "even" iteration i.e. when $y_{2,n}$ is the current input bit. Thus, considering an input bitstream in the order $y_{2,n-1}, y_{1,n-1}, y_{2,n}, y_{1,n}$, FIG. 11 shows that the output $v_{2,n}$ of the non-recursive encoder 1000 at the point where the present input bit is $y_{2,n}$ is the result of the modulo-2 addition of $y_{2,n}$ and $y_{2,n-1}$. Comparing this with the non-recursive encoder 410' of FIG. 8, it is therefore seen that the output $v_{2,n}$ given the present input $y_{2,n}$ and the previous inputs, is identical. Similarly, for the next input bit $y_{1,n}$, as shown in FIG. 10, the state bits of FIG. 11 have been shifted to the right within FIG. 10, such that the output of the non-recursive encoder block 1000 $v_{1,n}$ is the result of the modulo-2 addition of the present input bit $y_{1,n}$, and the state bit $v_{1,n-1}$ output from delay 1004. Compare this operation to that of the non-recursive encoder 410 in FIG. 8 operating on the deinterleaved bitstream $y_{1,n}$, and it will be seen that the output $v_{1,n}$ for the input bitstream $y_{1,n}$ is the same.

Thus, using the non-recursive encoder arrangement 1000, it does not become necessary to deinterleave the two input coded bitstreams $y_{1,n}$ and $y_{2,n}$, as an interleaved intermediately decoded output stream $v_{k,n}$ can be provided to the decoder 420. Thus, the need for the multiple non-recursive encoders as in the second embodiment is removed. However, it should be noted that the single non-recursive encoder 1000 of the third embodiment requires the same number of memory registers as the sum of the registers of the multiple non-recursive encoders 410, 410' etc. of the second embodiment. Generally, for encoded output streams which are interleaved, the number of memory registers in the equivalent NRC encoder 1000 is the sum of the number of memory registers used by the individual NRC encoders when the output streams are deinterleaved, as in the second embodiment. In the present example of the second and third embodiments, the total number of memory registers happens to be equal to the number of coded output streams, because for each of the n streams only one memory register is required by the individual encoders 410, 410' of the second embodiment (due to the feedback polynomial=1+D). However, more generally, in other embodiments where a more complicated feedback polynomial is used in the target recursive encoder, then more memory registers may be required in the non-recursive encoders 410, 410' of the second embodiment, and hence also in the single non-recursive encoder 1000 of the third embodiment.

More particularly, the multiple rate 1/1 non-recursive encoders in the second embodiment are individually defined by the matrix $G=(g0(D))$. Notice here that the single equivalent non-recursive encoder is defined by the matrix $G=(g0(D^2))$. As a matter of fact:

$g0(D)=1+D$ $g0(D^2)=1+D^2$

If y(n) is the current input sample of the single equivalent encoder and v(n) the current output sample then we can check that:

$v(n)=y(n)+y(n-2)$

This is effectively the same as:

$v1(n)=y1(n)+y1(n-1)$ $v2(n)=y2(n)+y2(n-1)$ when y1 and y2 are interleaved

Generally speaking, therefore, n rate 1/1 non-recursive encoders with identical generator matrix $G=(g0(D))$ operating on n deinterleaved streams, can be replaced with a single rate 1/1 non recursive encoder with generator matrix $G=(g0(D^n))$ operating on a single interleaved stream Thus far, the first to third embodiments previously described relate to rate 1/2 encoders i.e. where two output bits are generated for every single input bit. However, the present invention is not limited to decoders adapted to decode bitstreams produced by rate 1/2 encoders, and in other embodiments decoders for decoding bitstreams generated by any rate k/n encoder can be provided. Therefore, as further examples, the fourth and the fifth embodiments to be described next relate to decoding arrangements adapted to decode a bitstream encoded by the rate 2/3 recursive encoder of the prior art, described previously with respect to FIG. 3, and which are used as examples as to how a more general decoder for decoding a rate k/n encoded bitstream may be provided.

Figure 3:
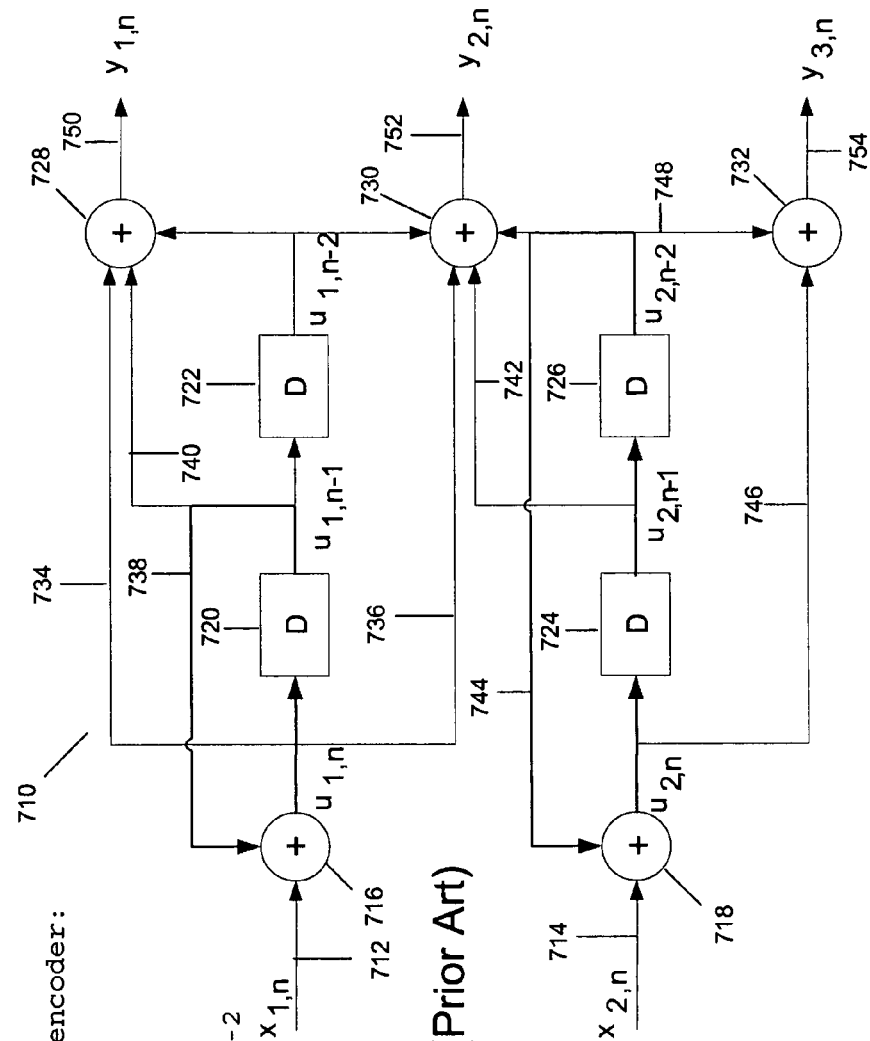
FIG. 3 is a block diagram illustrating a rate 2/3 recursive convolutional encoder of the prior art.

Before describing the fourth embodiment in detail, firstly consider again the rate 2/3 recursive encoder of FIG. 3, described previously. As with the first and second embodiments, the inventor has realised that such a rate 2/3, and, more generally, any rate k/n recursive encoder, can be represented by a purely recursive encoding operation, followed by a purely non-recursive encoding operation, as shown in FIG. 12.

Figure 12:
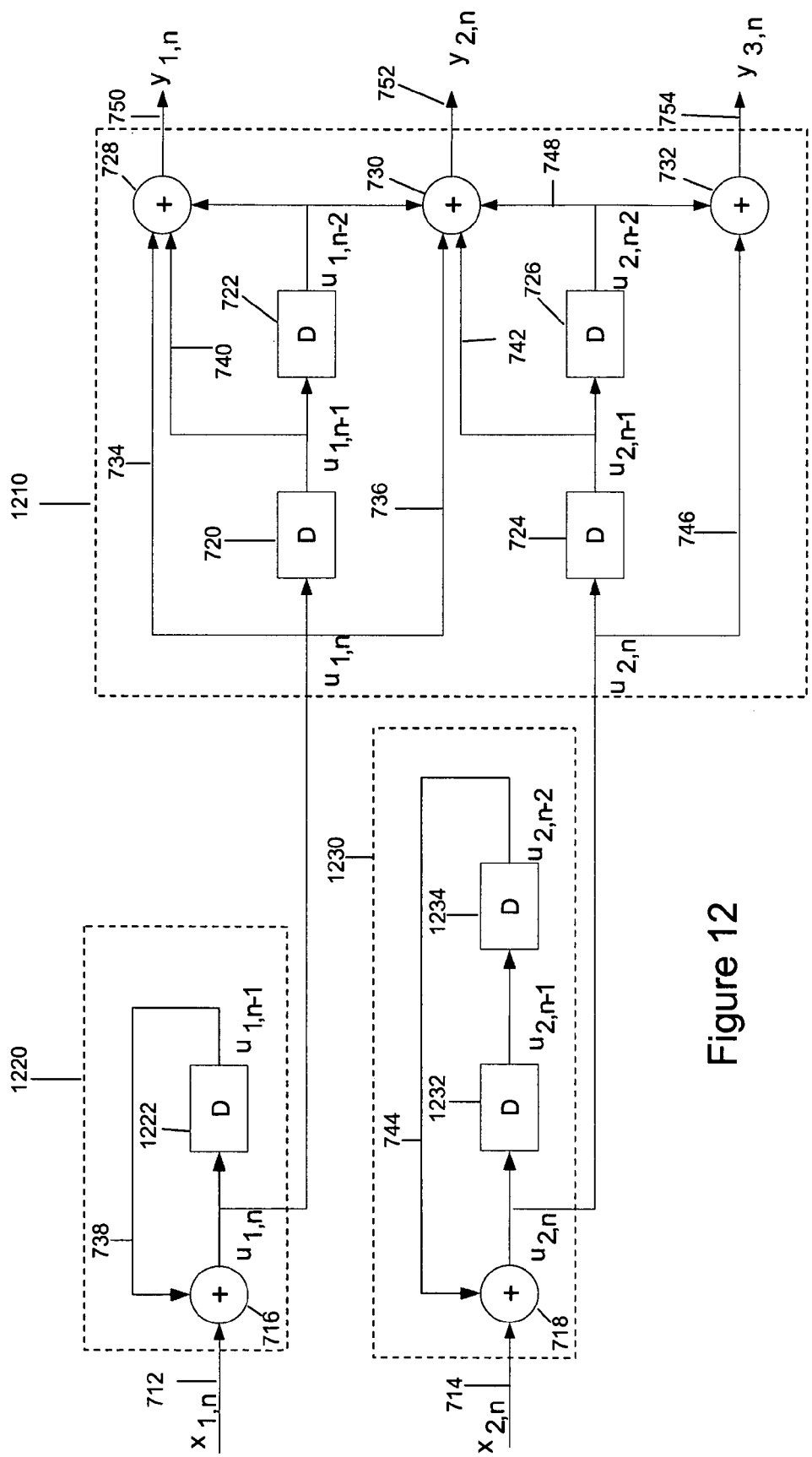
FIG. 12 is a block diagram illustrating both non-recursive and recursive convolutional encoders for use in explaining a fourth embodiment of the invention.

More particularly, as with the first and second embodiments, the inventor has realised that as shown in FIG. 12 a recursive encoding operation can be considered generally as a rate k/k purely recursive encoding operation, followed by a rate k/n purely non-recursive encoding operation. That is, the generator matrix for the whole recursive encoder G(D) can be considered to be the matrix product of the generator matrix of a rate k/k purely recursive encoder, and the generator matrix of a rate k/n non-recursive encoder i.e.:—

$G(D)=G_R(D) \cdot G_{NR}(D)$

Turning to the specific example of the rate 2/3 recursive encoder of FIG. 3, as shown in FIG. 12 this can be represented by two rate 1/1 purely recursive encoders 1220 and 1230, which themselves can be considered to be a rate 2/2 purely recursive encoder, with generator matrix $G_R(D)$. Specifically, the purely recursive encoder 1220 receives a first input bitstream $x_{1,n}$ on input line 712, into a modulo-2 adder 716. The modulo-2 adder 716 outputs a state bit $u_{1,n}$ into a one bit delay 1222. The output of the one bit delay 1222, second state bit $u_{1,n-1}$, is fed back via feedback line 738 into a second input of the modulo-2 adder 716.

For the second purely recursive encoder 1230, the second input bitstream to be coded $x_{2,n}$ is input on line 714 to a modulo-2 adder 718. The output of the modulo-2 adder, state bit $u_{2,n}$, is input to a first one bit delay 1232, the output of which, second state bit $u_{2,n-1}$, is input to a second one bit delay 1234. The output of the second one bit delay 1234, third state bit $u_{2,n-2}$, is fed back via feedback line 744 to a second input of the modulo-2 adder 718. The recursive encoders 1220 and 1230 can therefore be thought of as a rate 2/2 purely recursive encoder having generator matrix $G_{R(D)}$ as shown below:

$$G_R(D) = \begin{bmatrix} \frac{1}{g_{1,0}} & 0 \\ 0 & \frac{1}{g_{2,0}} \end{bmatrix}$$

where, in FIG. 12, the feedback polynomials are:—

$g_{1,0}(D)=1+D$; and $g_{2,0}(D)=1+D^2$

For the non-recursive encoding part 1210, this receives intermediately encoded bitstreams $u_{1,n}$ and $u_{2,n}$ corresponding to the first state bits of the recursive encoders 1220 and 1230. Internally, the non-recursive encoder 1210 reproduces those non-recursive elements of the target recursive encoder 710 of FIG. 3, described previously, to produce three coded bitstreams $y_{1,n}$, $y_{2,n}$ and $y_{3,n}$. The generator matrix of the non-recursive part is $G_{NR(D)}$, as shown below:—

$$G_{NR}(D) = \begin{bmatrix} g_{1,1} & g_{1,2} & g_{1,3} \\ g_{2,1} & g_{2,2} & g_{2,3} \end{bmatrix}$$

and where, in the case of FIG. 12, the individual generator polynomials are:

$g_{1,1}(D)=1+D+D^2$;

$g_{1,2}(D)=1+D^2$;

$g_{1,3}(D)=0$;

$g_{2,1}(D)=0$;

$g_{2,2}(D)=D+D^2$;

$g_{2,3}(D)=1+D^2$

It should be noted that the above noted representation of the recursive encoder 710 of FIG. 3 is a virtual representation i.e. that the encoder can virtually be represented as having the purely recursive parts 1220 and 1230, and the non-recursive part 1210.

Figure 13:
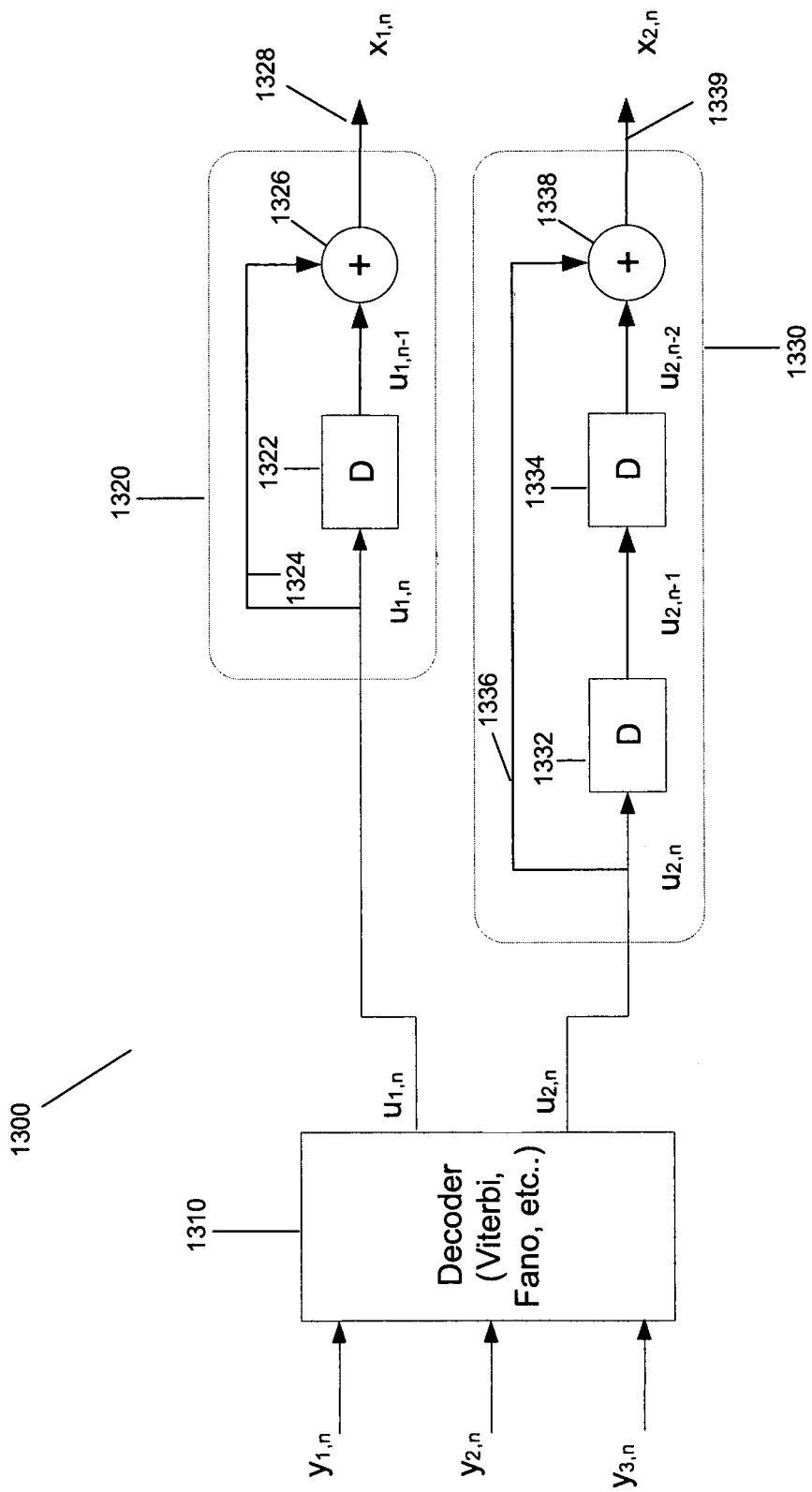
FIG. 13 is a block diagram of a fourth embodiment of the invention.

In view of the above described realisation that the operation of a recursive rate k/n encoder can be considered as the combination of the operation of a rate k/k purely recursive encoder, followed by a rate k/n non-recursive encoder, the inventor has realised that in order to provide a corresponding decoder, a decoder arrangement which essentially reverses the above coding steps can be provided. That is, a decoder arrangement according to the fourth embodiment provides a decoder which decodes the non-recursive parts of the recursive encoder, followed by a decoder part which decodes the purely recursive encoding parts. Such an arrangement is shown in FIG. 13.

A decoder arrangement 1300 according to the fourth embodiment therefore receives as input thereto the three coded bitstreams $y_{1,n}$, $y_{2,n}$ and $y_{3,n}$. In order to decode the coding due to the non-recursive part of the recursive encoder, a conventional non-recursive decoder 1310 is provided, which, as described previously with respect to the first and second embodiments, may operate according to any conventional non-recursive decoding algorithm, such as the Viterbi algorithm, the Fano algorithm, or the like. The non-recursive decoder 1310 partially decodes the received encoded bitstreams, to provide intermediately decoded bitstreams $u_{1,n}$ and $u_{2,n}$. The bitstream $u_{1,n}$ is input into a first non-recursive encoder element 1320, and the bitstream $u_{2,n}$ is input into a second non-recursive encoding element 1330. The non-recursive encoding element 1320 is arranged according to the feedback polynomial of the virtual purely recursive encoding element 1220 of FIG. 12. Similarly, the non-recursive encoding element 1330 has a generator polynomial which is the feedback polynomial of the purely recursive encoding element 1230 of FIG. 12. Therefore, the non-recursive encoding element 1320 comprises a one bit delay 1322 into which the intermediately decoded bitstream is received, and then this is output to a modulo-2 adder 1326. Additionally, a feed forward line 1324 feeds forward the received intermediately decoded bitstream to a second input of the modulo-2 adder 1326. The output of the modulo-2 adder on line 1328 then represents the completely decoded first input bitstream $x_{1,n}$.

For the second non-recursive encoding element 1330, two one bit delays 1332 and 1334 are provided in sequence. A modulo-2 adder 1338 receives the output from the second of the one bit delays 1334. A feed forward line 1336 feeds forward the received intermediately decoded bitstream $u_{2,n}$ into a second input of the modulo-2 adder 1338, whilst the same input is also fed into the first one bit delay 1332. The output of the modulo-2 adder 1338 on output line 1339 then represents the completely decoded second input bitstream $x_{2,n}$.

It should be noted that together the rate 1/1' non-recursive encoding elements 1320 and 1330 can be thought of as a rate 2/2 non-recursive encoder, having a generator matrix equal to the matrix inverse of the generator matrix $G_{R(D)}$ of the virtual purely recursive part of the target recursive encoder. That is, the generator matrix of the non-recursive encoding elements 1320 and 1330 together is as follows:—

$$G_R^{-1}(D) = \begin{bmatrix} g_{1,0} & 0 \\ 0 & g_{2,0} \end{bmatrix}$$

Figure 14:
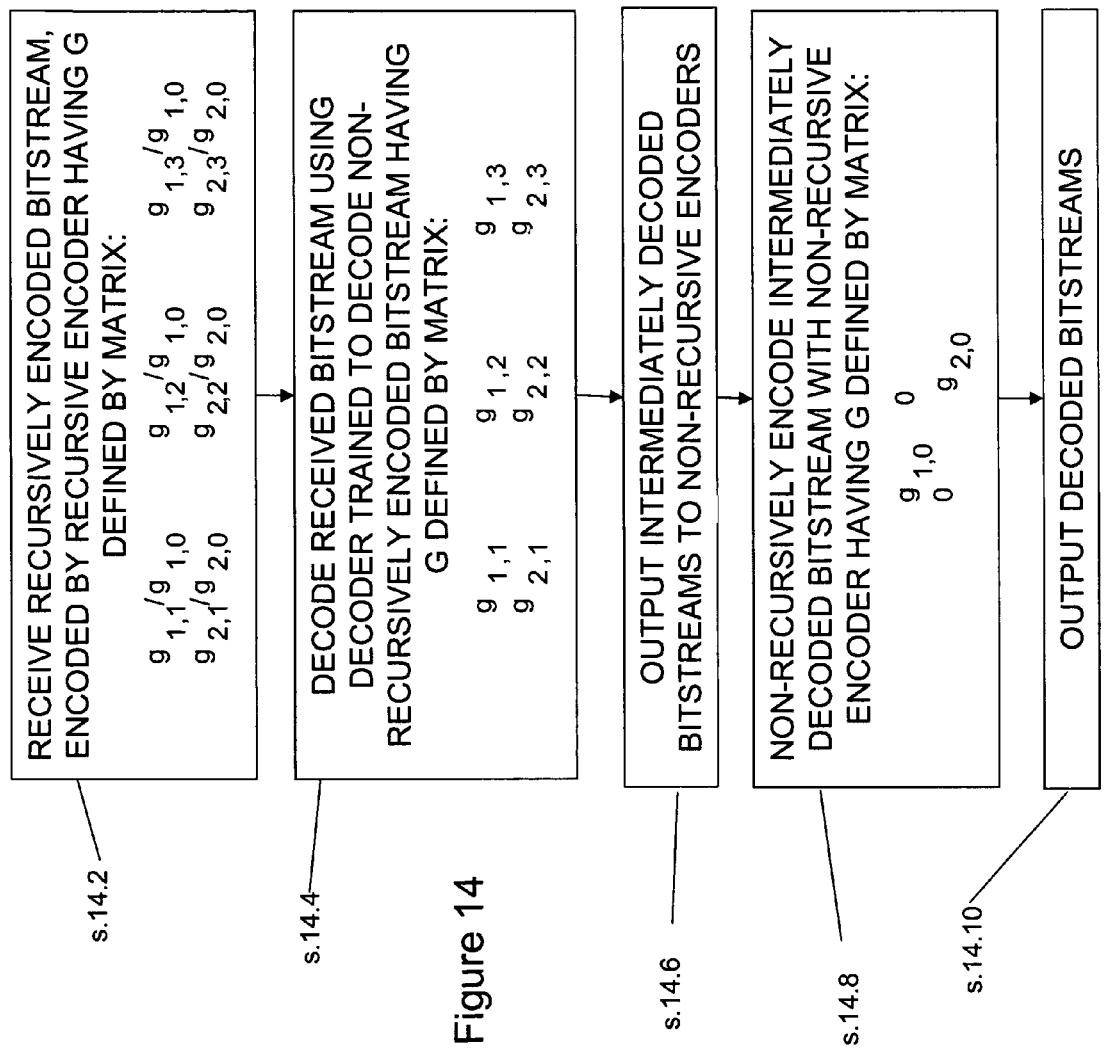
FIG. 14 is a flow diagram illustrating the steps performed according to a method of the fourth embodiment of the invention.

Further details of the operation of the decoding arrangement 1300 of FIG. 13 will be described with respect to FIG. 14. FIG. 14 is a flow diagram illustrating the operation of the decoding arrangement 1300. More particularly, at step 14.2 the decoding arrangement 1300 receives the recursively encoded bitstream. As discussed, the encoded bitstream has been encoded by a recursive encoder having a generator matrix G(D). For example, for a rate 2/3 recursive encoder G(D) is as follows:—

$$G(D) = \begin{bmatrix} \frac{g_{1,1}}{g_{1,0}} & \frac{g_{1,2}}{g_{1,0}} & \frac{g_{1,3}}{g_{1,0}} \\ \frac{g_{2,1}}{g_{2,0}} & \frac{g_{2,2}}{g_{2,0}} & \frac{g_{2,3}}{g_{2,0}} \end{bmatrix}$$

The received encoded bitstreams are input into the conventional non-recursive decoder 1310 which has been trained to decode a non-recursively encoded bitstream having a generator matrix defined by the matrix $G_{NR(D)}$ as discussed previously. As will be seen, this corresponds to the numerator part of the matrix elements of the generator matrix of the entire recursive encoder.

At step 14.6 the intermediately decoded bitstreams are then output to the non-recursive encoder elements 1320 and 1330, which can together be considered to be a rate 2/2, or, more generally, k/k, non-recursive encoder having a generator matrix $G_R^{-1}(D)$, as described previously. The non-recursive encoder then non-recursively encodes the intermediately decoded bitstream at step 14.8, to give the effect of completely decoding the bitstreams. The completely decoded bitstreams, which now correspond to the input bitstreams $x_{1,n}$ and $x_{2,n}$, are then output, at step 14.10.

Thus, according to the fourth embodiment, the advantages of the first and second embodiments that a conventional non-recursive decoder trained to decode a non-recursive code can also be used, with appropriate post processing, to decode a recursively encoded bitstream are obtained. Moreover, as discussed above, this technique can be applied more generally to any rate k/n recursively encoded bitstream.

Within the fourth embodiment just described, which relates to a rate 2/3 code, it can be seen that 2 non recursive coding elements 1320 and 1330 are required, together having a generator matrix $G_R^{-1}(D)$. The two non-recursive coding elements 1320 and 1330 are in this case different, as the generator polynomials within the generator matrix are different. Of course, if the generator polynomials within the generator matrix were identical to each other, then the non-recursive coding elements 1320 and 1330 would also be identical to each other.

Figure 23:
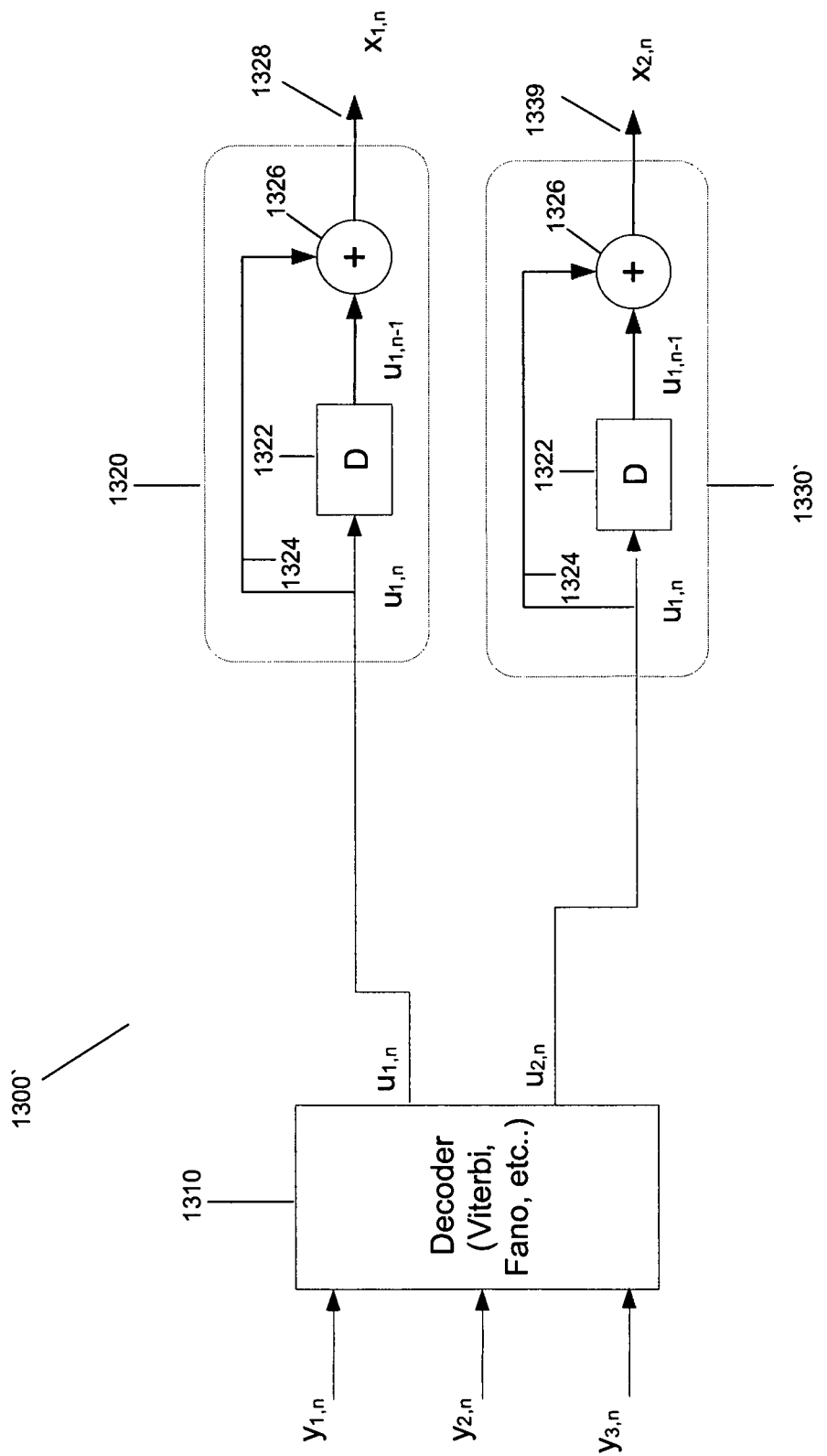
FIG. 23 is a block diagram of a further embodiment of the invention, being a variant of the fourth embodiment.

With the above in mind, in a variant of the fourth embodiment which represents a special case thereof, where the coded bitstream has been encoded by a recursive encoder having identical feedback polynomials i.e. the recursive part of the generator matrix is, for an example rate 2/2 encoder:

$$G_R(D) = \begin{bmatrix} \frac{1}{g_{1,0}} & 0 \\ 0 & \frac{1}{g_{1,0}} \end{bmatrix}$$

then the generator matrix of the non-recursive encoding elements in the corresponding decoder becomes:

$$G_R^{-1}(D) = \begin{bmatrix} g_{1,0} & 0 \\ 0 & g_{1,0} \end{bmatrix}$$

i.e. the non recursive encoding elements 1320 and 1330 are the same, as shown in FIG. 23. In this special case, where the generator polynomials of the non-recursive encoding elements are the same, therefore, then as with the third embodiment described previously where identical pre-processing elements were involved, in the present special case variant of the fourth embodiment then the identical post-processing non-recursive encoders may be combined together, and an interleaved output stream from the non-recursive code decoder output thereto, as shown in FIG. 24.

Figure 24:
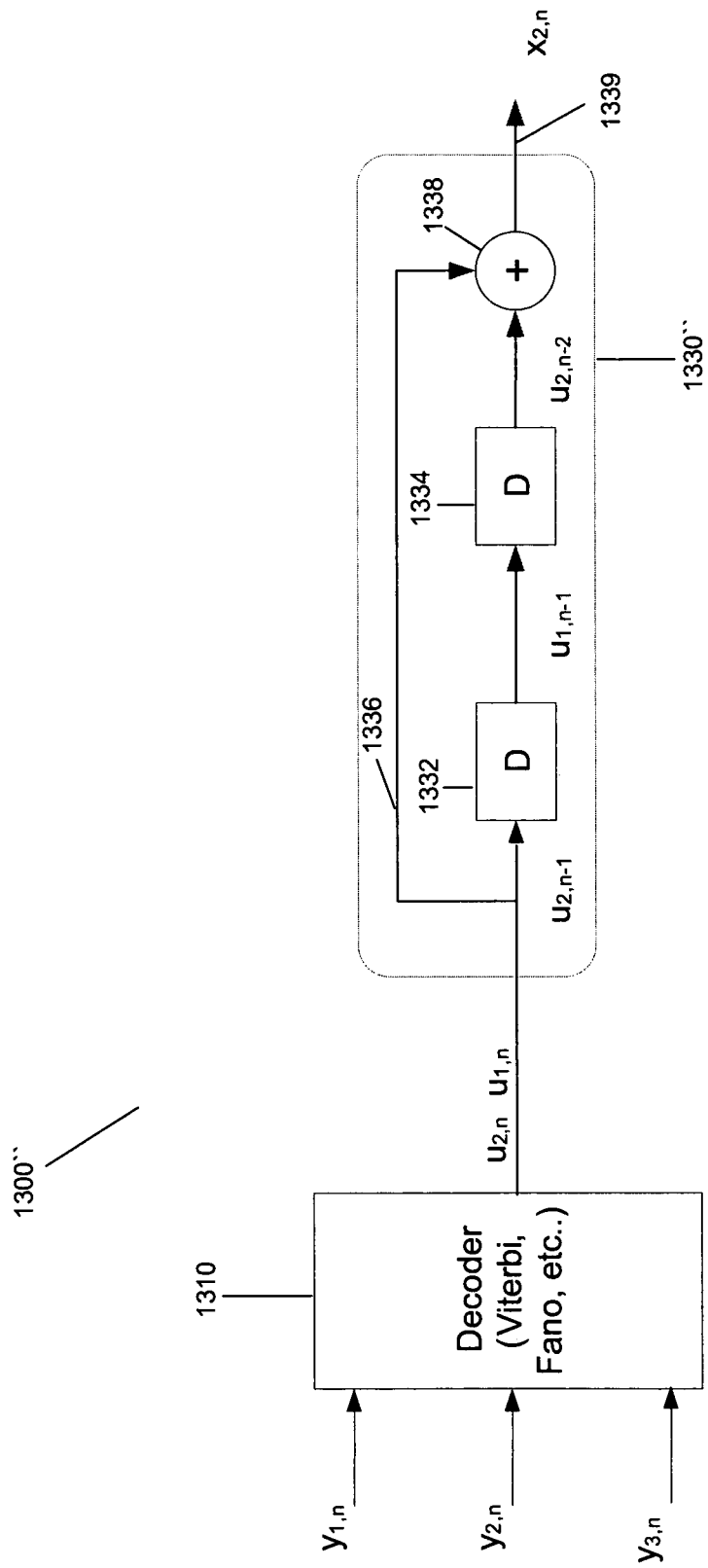
FIG. 24 is a block diagram of a further embodiment of the invention, being another variant of the fourth embodiment.

More particularly, with reference to FIG. 24, here a decoder arrangement 1300" is provided, where an interleaved output bitstream $u_{2,n-2}, u_{1,n-1}, U_{2,n-1}, u_{1,n}, u_{2,n}, \ldots$ is output from decoder 1310 into non recursive encoding element 1330". Non-recursive encoding element 1330" has the same number of symbol delays as the sum of the corresponding individual non-recursive encoding elements 1320 and 1330' in FIG. 23, in this case two. The operation of the single non-recursive encoding element 1330" acting as a post-processor is then substantially identical to the operation of the single non-recursive encoding element of the third embodiment acting as a pre-processing element, that is, on an "odd" cycle the interleaved bits $u_{1,n-1}, u_{1,n}$, etc. are processed, whilst on an "even" cycle the interleaved bits $u_{2,n-1}, u_{2,n}$, etc. are processed. In this way, for the special case where the feedback polynomials of the recursive part of the target encoder are identical, in this variant of the fourth embodiment a simpler implementation can be obtained than with the fourth embodiment which allows the use of an interleaved output from the decoder 1310.

Generally speaking, therefore, k rate 1/1 non-recursive encoders with identical generator matrix $G=(g0(D))$ operating on k deinterleaved streams, can be replaced with a single rate 1/1 non recursive encoder with generator matrix $G=(g0(D^k))$ operating on a single interleaved stream.

It should be seen that the fourth embodiment previously described is the more generalised version of the first embodiment described previously, but extended to take into account rate k/n encoders, where k is greater than 1. Following the first embodiment we were able to describe a second embodiment, which essentially reversed the processing order of the first embodiment. It may, therefore, be thought that with respect to the fourth embodiment, it is possible to provide a fifth embodiment which essentially reverses the processing order i.e. permits a non-recursive encoding operation to be performed, followed by the conventional non-recursive decoding operation. However, because matrix products are not commutative, it is generally not possible to express the generator matrix of a whole rate k/n recursive encoder as the matrix product of the generator matrix of the non-recursive parts, and the generator matrix of the recursive parts, in that order. However, there is a special case where it is possible to express the whole generator matrix of a rate k/n recursive encoder in this order, and that is where the feedback polynomials of each recursive part of the encoder are identical. Thus, where, for example, for a rate 2/3 recursive encoder, the feedback polynomials give a generator matrix for the recursive part $G_{R(D)}$ as follows:—

$$G_R(D) = \begin{bmatrix} \frac{1}{g_{1,0}} & 0 & 0 \\ 0 & \frac{1}{g_{1,0}} & 0 \\ 0 & 0 & \frac{1}{g_{1,0}} \end{bmatrix}$$

then it is possible to express the generator matrix as the matrix product of the recursive part followed by the non-recursive part. In this case, the entire generator matrix of the target recursive encoder would be G(D) as shown below:—

$$G(D) = \begin{bmatrix} \frac{g_{1,1}}{g_{1,0}} & \frac{g_{1,2}}{g_{1,0}} & \frac{g_{1,3}}{g_{1,0}} \\ \frac{g_{2,1}}{g_{1,0}} & \frac{g_{2,2}}{g_{1,0}} & \frac{g_{2,3}}{g_{1,0}} \end{bmatrix}$$

where in this case the generator matrix $G_{NR}(D)$ is the same as described previously with respect to the fourth embodiment.

Figure 15:
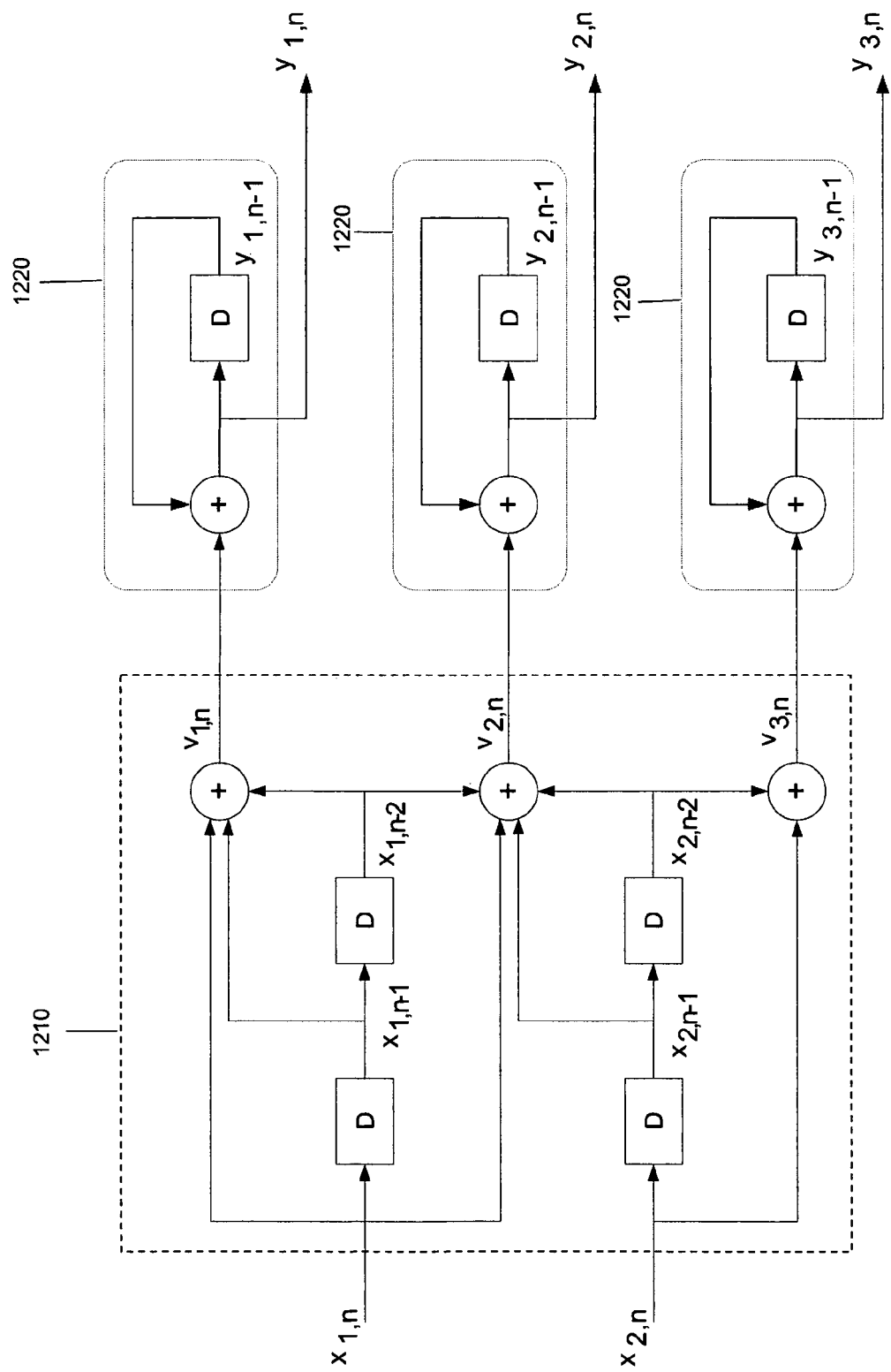
FIG. 15 is a block diagram illustrating both non-recursive and recursive convolutional encoders for the purposes of describing a fifth embodiment of the invention.
Figure 16:
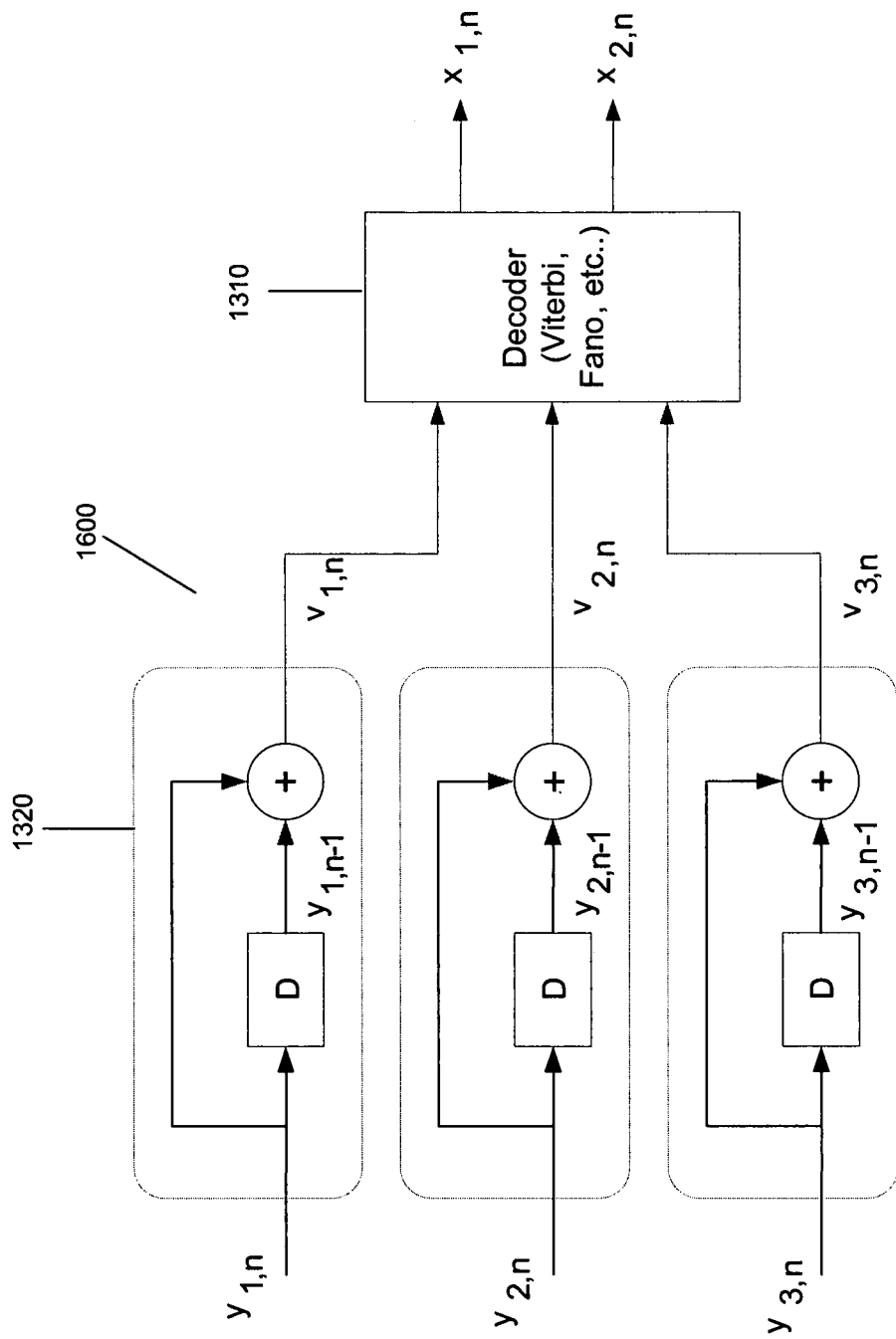
FIG. 16 is a block diagram of a fifth embodiment of the invention.

FIG. 15 illustrates an example decomposition of a recursive encoder having identical feedback polynomials decomposed into a virtual non-recursive part 1210, and virtual purely recursive encoding parts 1220. Within FIG. 15 the specific generator polynomials are as follows:—

$g_{1,1}(D)=1+D+D^2$;

$g_{1,2}(D)=1+D^2$;

$g_{1,3}(D)=0$;

$g_{2,1}(D)=0$;

$g_{2,2}(D)=D+D^2$;

$g_{2,3}(D)=1+D^2$; and $g_{1,0}(D)=1+D$ from which it will be seen that each of the purely recursive encoding parts 1220 are identical, reflecting the identical feedback, polynomials.

With a recursive encoding which can be represented as such i.e. with identical feedback polynomials for the recursive part, according to a fifth embodiment of the invention a decoding arrangement 1600 can be provided which receives encoded bitstreams, in this case the three bitstreams $y_{1,n}$, $y_{2,n}$, and $y_{3,n}$, into respective rate 1/1 non-recursive encoders 1320. The non-recursive encoders 1320 are each configured in accordance with the common feedback polynomial of the target recursive encoder i.e. the generator polynomial G(D) of each non-recursive encoder 1320 equals $g_{1,0}(D)$. Alternatively, the three non-recursive encoders 1320 can together be thought of as a single rate 3/3 non-recursive encoder, having a generator matrix equal to the matrix inverse of the generator matrix of the recursive part of the target recursive encoder i.e.:—

$$G_R^{-1}(D) = \begin{bmatrix} g_{1,0} & 0 & 0 \\ 0 & g_{1,0} & 0 \\ 0 & 0 & g_{1,0} \end{bmatrix}$$

The non-recursive encoders 1320 non-recursively encode the received encoded bitstreams to produce intermediately decoded bitstreams $v_{1,n}$, $v_{2,n}$ and $v_{3,n}$, which are then input into a conventional non-recursive decoder 1310, which again operates according to a conventional algorithm, such as the Viterbi algorithm or the Fano algorithm, or the like. The conventional non-recursive decoder 1310 is trained to decode a non-recursively encoded bitstream encoded by a non-recursive encoder having a generator matrix corresponding to the non-recursive part of the target recursive encoder. In the present specific example, therefore, the non-recursive decoder 1310 is trained to decode an encoded bitstream as if the bitstream had been encoded by the non-recursive encoding part 1210 of FIG. 15. The operation of the non-recursive decoder 1310 completes the decoding process, and the original input bitstreams $x_{1,n}$ and $x_{2,n}$ are recovered.

Figure 17:
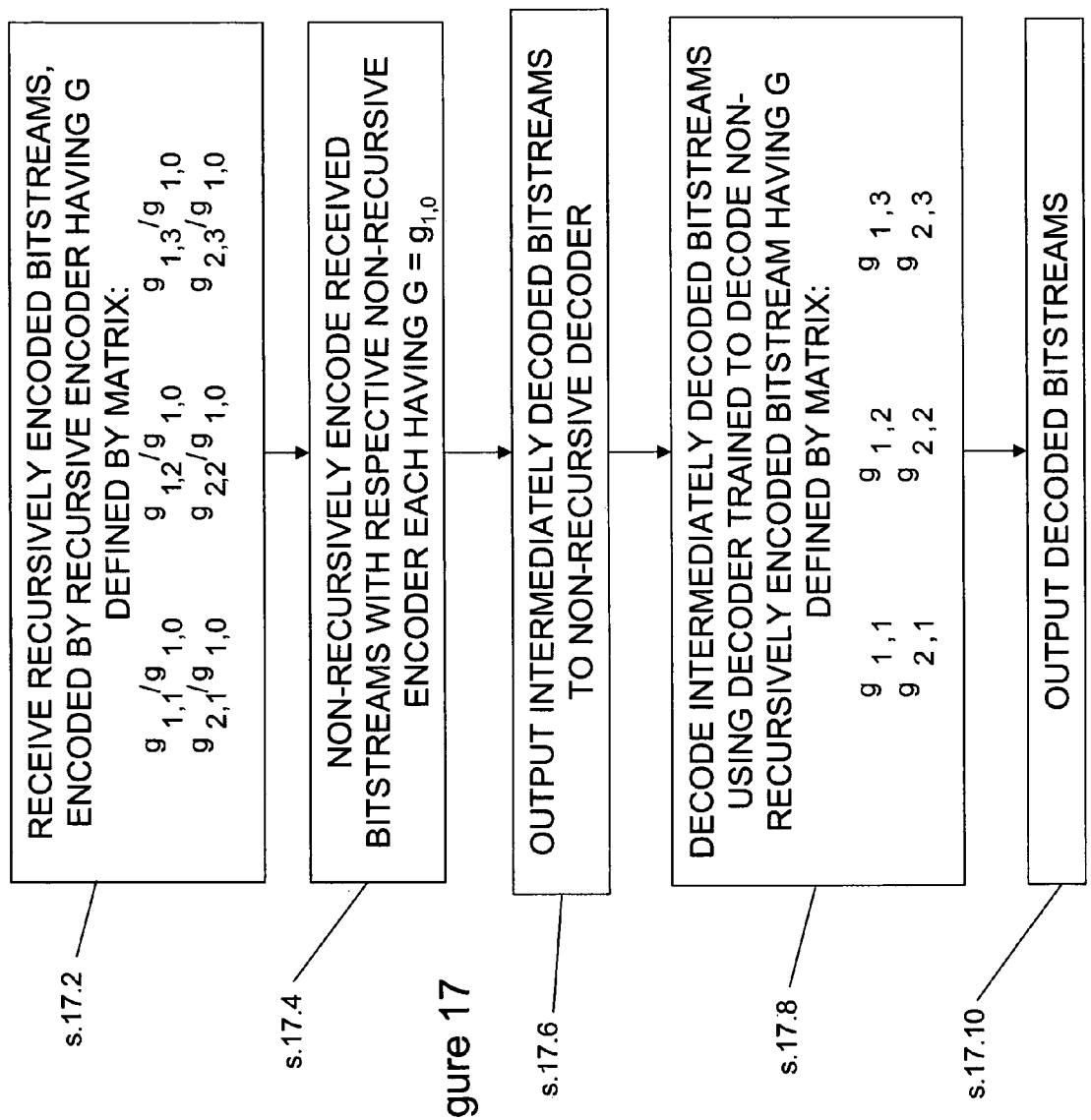
FIG. 17 is a flow diagram illustrating the steps performed by the fifth embodiment of the invention.

The operation of the decoding arrangement 1600 as just described is also shown in more detail in FIG. 17, to which the reader is referred.

Thus, with the fifth embodiment the same advantages as previously described in respect of the first and second embodiments can also be obtained, but for rate k/n encoders, and where, instead of a post processing operation as in the fourth embodiment, a pre-processing non-recursive encoding operation is performed. However, as discussed previously, the fifth embodiment can only be applied in the special case where the feedback polynomials of the target recursive encoder are all identical. Where this is not the case, then it would not be possible to use the fifth embodiment to decode a recursively encoded bitstream from a recursive encoder where feedback polynomials are not identical.

The fifth embodiment presents the same drawbacks as the previously described second embodiment, in that a non-recursive encoder element 1320 is required for each of the encoded bitstreams. This can be problematic for hardware implementations, as discussed previously in respect of the second embodiment, but again, for software implementations this is not problematic, as the same routine can simply be called as many times as required. Moreover, the problem can also be overcome in the same manner as previously described in respect of the third embodiment, that is, by providing a single non-recursive encoding element, but with the same number of one bit delay memory registers arranged in sequence as there are in total in the n individual non-recursive encoders. Then, the input bitstream can remain interleaved whilst the same operation is obtained.

The above described embodiments each relate to decoder arrangements adapted to operate on hard decision symbols, that is symbols where a decision has been taken earlier within the processing chain in any receiver in which the decoder is employed, for example within the demodulator and symbol detector. However, as is known in the art it is also possible for a convolutional decoder to operate on soft decision symbols, that is symbols represented by a sign (+ or −) to represent the detected symbol value, as well as a confidence value indicating the confidence in the determined sign. Other types of soft decision representation are also possible, for example a signed or even unsigned three bit soft decision representation (three bits allowing for eight values) can allow for the first four values to represent four levels of confidence that the symbol is zero, and the second four values representing four possible confidence values that the received symbol was 1. The use of soft decision symbol representation (soft bits) within convolutional decoders is well known in the art. For example Sachi T et al "Soft Decision Viterbi Decoding With Diversity Combining", Global Telecommunications Conference, 1990, 2-5 Dec. 1990, pages 1127 to 1131, Volume 2, describes an example of such a soft decision Viterbi decoder. Many other references are also available.

Within the previously described hard decision embodiments, a conventional hard decision input/hard decision output decoder adapted to decode a bitstream encoded with a non-recursive convolutional code corresponding to a virtual non-recursive part of a target recursive convolutional encoder is used for the decoding of a recursively encoded bitstream. In order to complete the decoding, a pre or post processing step is used which, in the hard decision embodiments, corresponds to a rate 1/1 non-recursive encoding operation. More particularly, where pre-processing was used, then a respective rate 1/1 non-recursive encoding operation was used on each of the n input coded bitstreams, which could be thought of as a rate n/n non-recursive encoding operation. Where post processing was used, then a rate 1/1 non-recursive encoding operation is applied to the k outputs of the conventional non-recursive decoder. Again, this can be thought of as applying a rate k/k non-recursive encoding operation to the k outputs of the non-recursive decoder, to obtain the k original inputs.

Figure 18:
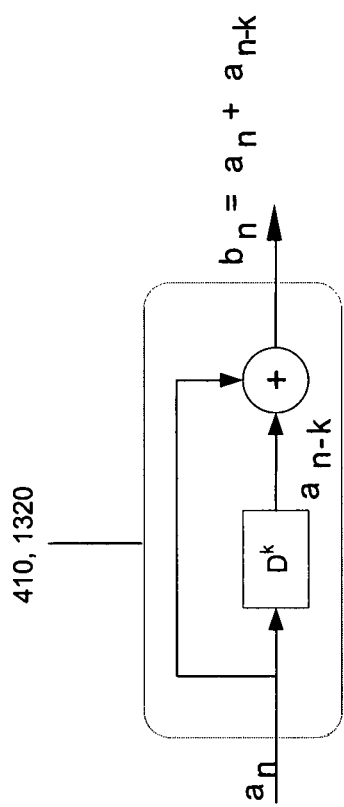
FIG. 18 is a diagram of a rate 1/1 non-recursive encoder used in embodiments of the invention.

FIG. 18 shows again the typical pre or post processing non-recursive encoding block 410 or 1320 used in the previously described embodiments. As will be seen, it is typically a rate 1/1 non-recursive encoder having a straightforward generator polynomial $G(D)=1+D^k$, where $D^k$ represents a delay of k symbols. The output symbol $b_n$ is therefore equal to the result of the modulo-2 addition of the present input symbol $a_n$ and the previous input symbol $a_{n-k}$. We have termed this processing a non-recursive encoding operation, as such operation is commonly used in a transmitter, for coding hard decision input symbols, even though in this case we are concerned with a decoder, which would be typically (although not necessarily exclusively) be present in a receiver. However, when operating with soft decision symbols the concept of a "soft decision encoder" does not really make much sense, as soft decisions are typically only used in a receiver. Additionally, at some point in the receiver data processing chain, a conversion from soft decisions to hard decisions is typically made, as ultimately the baseband data output of the receiver is usually required to be in hard decision format.

Figure 19:
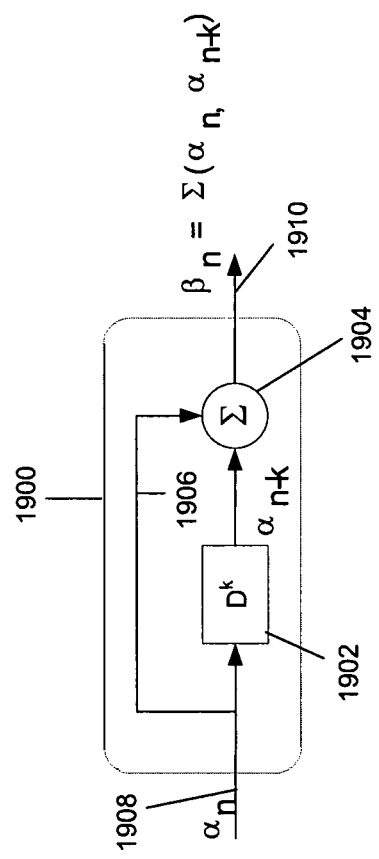
FIG. 19 is a block diagram of a processing block arranged to process soft decision input data in further embodiments of the invention.

Nevertheless, the concepts of the present invention of allowing a conventional non-recursive decoder to decode a recursively encoded bitstream provided that some pre or post processing is applied can be used with soft decision input symbols by using a similar pre or post processing operation adapted to operate with soft decision inputs. Additionally, within the embodiments to be described below, the soft decision processing which is performed is analogous to the hard decision rate 1/1 non-recursive encoding used in the previous embodiments. Such a processing block adapted for use with soft decision input symbols is shown in FIG. 19. Note that this processing block of FIG. 19 relates to a generator polynomial of the form $g(D)=1+D^k$; further details as to how to represent more complicated generator polynomials in soft decision form will be given later.

More particularly, referring to FIG. 19 a soft decision pre or post processing block 1900 which may be used in further embodiments to be described comprises an input line 1908, on which soft decision inputs $\alpha_n$ are received. These are input into a soft decision k bit delay 1902, and by "k bit delay" we mean essentially a k output symbol delay. Thus, for example, where one output symbol is represented by a three bit soft decision input, then the delay 1902 would output the three bits representing the soft decision symbol for each output symbol that is required from the decoder.

The delay 1902 outputs the delayed soft decision symbols to an adder 1904, which is adapted to apply a specific Σ function, or, in other implementations, an approximation thereof, as described later. A feed forward line 1906 feeds the input soft decision symbols to a second input of the adder 1904. An output line 1910 is provided from the adder, on which is output soft decision symbols $\beta_n$, as a result of the Σ function applied in the adder 1904.

The sigma function applied by the adder 1904 to give the output stream $\beta_n$ and which provides an analogous operation within the soft decision pre or post processing block 1900 to the rate 1/1 non-recursive encoding block 410 or 1320 of the previously described embodiment is as follows:—

$$\Sigma(\alpha_n, \alpha_{n-k}) = \ln\left[\frac{1+e^{\alpha_n+\alpha_{n-k}}}{e^{\alpha_n}+e^{\alpha_{n-k}}}\right]$$

The derivation of this Σ function indicating how it is analogous to the modulo-2 addition applied to hard decision symbols is given in Appendix 1. In other embodiments, in order to make the implementation of the pre or post processing block 1900 easier, and in particular that of the adder 1904, the Σ function can be approximated as follows (note that this represents one possibility—other approximations are possible, but the approximation below is one of the simplest available, and to implement):—

$$\Sigma(\alpha_n,\alpha_{n-k}) \approx sgn(\alpha_n) \cdot sgn(\alpha_{n-k}) \cdot \mathrm{Min}(|\alpha_n|,|\alpha_{n-k}|)$$

where the function sgn(x) is a function that returns a +1, or a −1 value, dependent on the sign (+ or −) of x.

Figure 20:
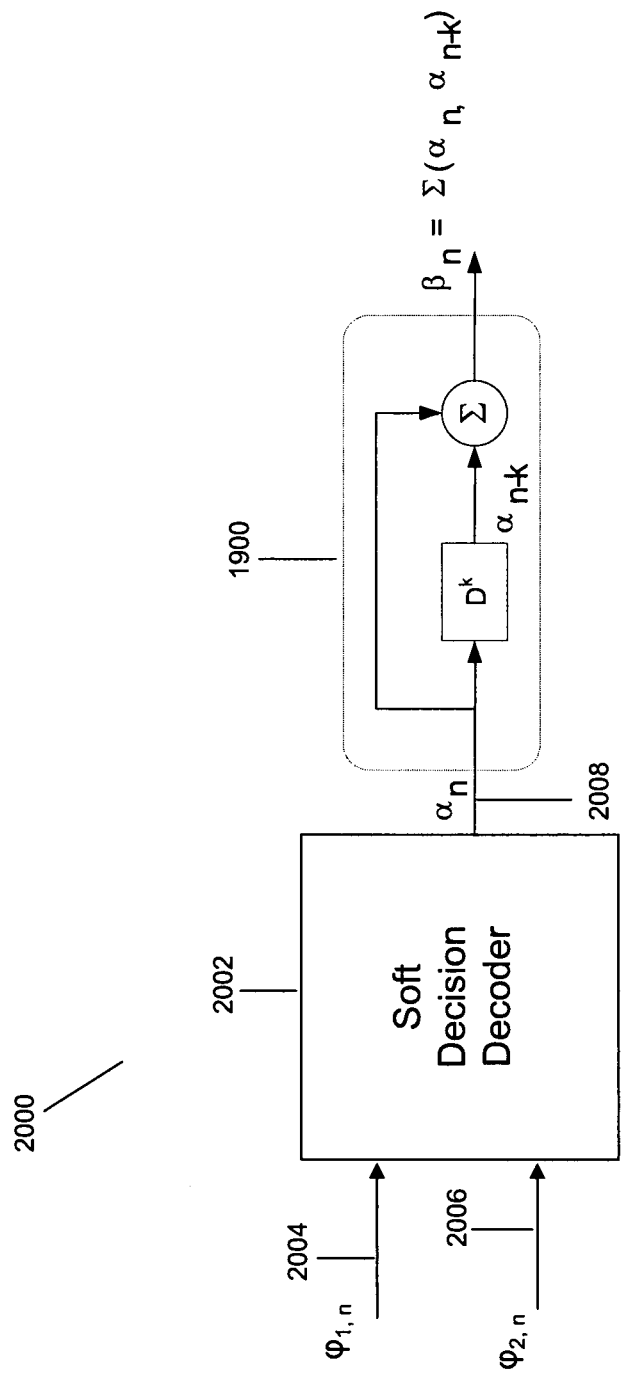
FIG. 20 is a block diagram of a sixth embodiment of the invention.

With the above described pre or post processing block 1900, further embodiments of the invention are then able to provide decoder arrangements which can operate on soft decision symbols, as well as hard decisions: FIG. 20 illustrates a sixth embodiment of the invention adapted to operate on soft decision input symbols, using the processing block 1900 as a post processing block. In this respect, the sixth embodiment shown in FIG. 20 is analogous to the first embodiment, described previously, and is adapted to operate on a coded bitstream produced by the rate 1/2 recursive encoder of FIG. 2, described previously (when the symbol delay k is equal to 1).

More particularly, a decoding arrangement 2000 according to the sixth embodiment comprises a conventional soft decision output decoder 2002 which receives, in this example, two coded input streams represented as soft decision symbols $\phi_{1,n}$ and $\phi_{2,n}$, received on respective input lines 2004 and 2006. The soft decision decoder 2002 is a conventional soft decision output decoder, such as a soft decision viterbi decoder or the like, and which is adapted to decode a non-recursively encoded bitstream produced by a non-recursive encoder having generator polynomials the same as the generator polynomials of the non-recursive part of the target recursive encoder, in the same manner as the previously described embodiments. The conventional soft decision output decoder 2002 outputs in this case a single intermediately decoded bitstream on output line 2008 to the post processing block 1900, which is the same as described previously with respect to FIG. 19. The intermediately decoded bitstream is a stream of soft bits, representing the soft output of the decoder. The post processing block 1900 applies the Σ function as described previously (or, in alternative embodiments the approximation thereof) to produce a completely decoded stream of soft decision symbols. The decoded output can then be subsequently input into a soft decision to hard decision converter, to obtain a final hard decision output. Alternatively, the soft decision symbols may be subject to further processing in other elements of a receiver prior to being finally converted into hard decision symbols.

However, as with the previously described hard decision embodiments, the use of the post processing block 1900 adapted to operate on soft decision inputs allows within this embodiment a conventional soft output non-recursive decoder which is adapted to decode a non-recursively encoded bitstream to be used to decode a recursively encoded bitstream. Thus, all of the advantages of the previous embodiments such as allowing for component and gate reuse, and reduced silicon area in hardware implementations, as well as reduced complexity in software implementations, are obtained with the presently described embodiment, but with the further advantage that it is able to operate on soft decision input symbols.

Figure 21:
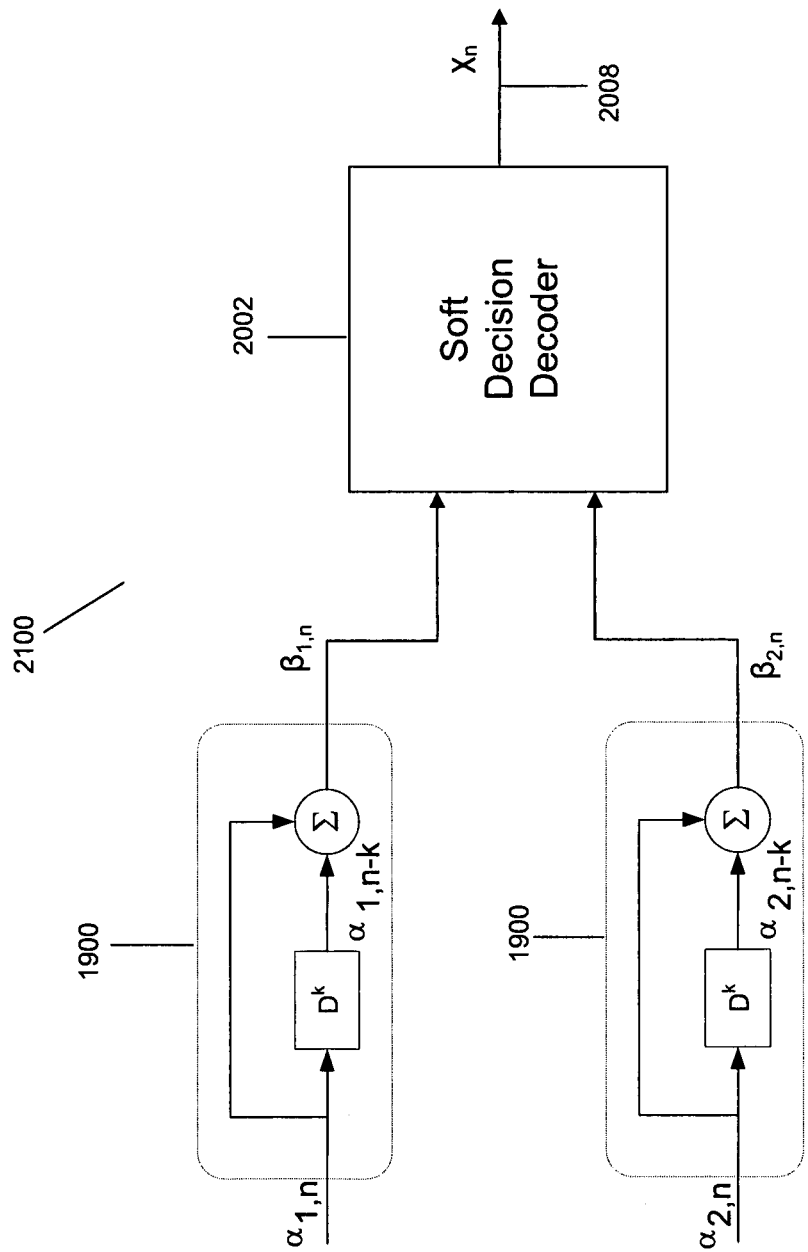
FIG. 21 is a block diagram of a seventh embodiment of the invention.

Additionally, a further embodiment is described in FIG. 21. As with the relationship between the first and second embodiments described previously, so the decoding arrangement 2100 shown in FIG. 21 has, the same relationship to the decoding arrangement 2000 of FIG. 20. That is, in the decoding arrangement 2100 of FIG. 21, instead of a post processing operation being performed, a pre-processing operation is performed on the input soft decision bitstreams, by the soft decision processing modules 1900. This provides intermediately decoded soft decision bitstreams, which can then be input into a conventional soft decision input non-recursive decoder 2002, which provides the final soft decision output, on output line 2008. The decoding arrangement 2100 of FIG. 21 also presents the same advantages as the previously described embodiments, but, as with the second embodiment described previously, has the same disadvantage that a separate pre-processing block 1900 is required for every input soft decision bitstream. However, again as with the hard decision equivalents described previously, this drawback can be alleviated if the arrangement is implemented in software, and likewise, as previously described in respect of the third embodiment, the individual soft decision pre-processing blocks 1900 can be combined in the same manner as described previously with respect to FIG. 3, although the overall number of memory registers required remains the same.

The above described embodiments of FIGS. 20 and 21 describe decoding arrangements adapted to decode rate 1/2 encoded bitstreams. However, the principles expressed therein can be readily applied more generally to provide decoding arrangements adapted to decode rate k/n encoded bitstreams which use soft decision symbol representations. For example, and generally, the soft decision pre or post processing block 1900 can be, used as a substitute for the non-recursive encoding block 410 or 1320 in the previously described hard decision embodiments, with a soft decision input or output decoder (as appropriate) then being substituted for the hard decision decoder in those embodiments. With such substitutions, a soft decision decoder for decoding any rate k/n recursively encoded bitstream can be obtained.

Figure 22:
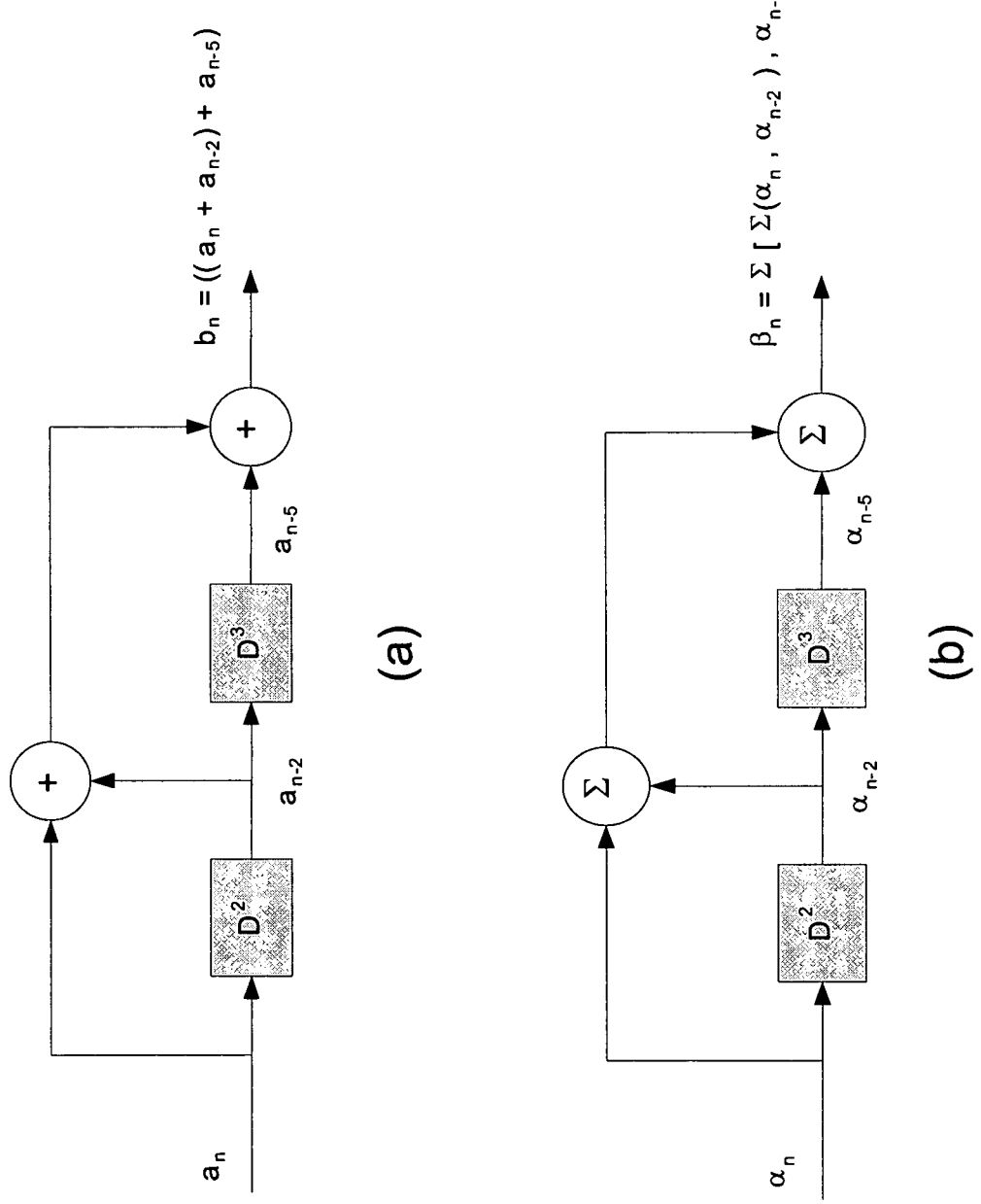
FIG. 22(a) is a block diagram of a non-recursive encoder according to a relatively complex generator polynomial.
FIG. 22(b) is a block diagram of a soft decision input processing block analagous to the non-recursive encoder of FIG. 22(a)

As mentioned, the soft decision processing block 1900 described above can be used to represent generator polynomials of the form $g(D)=1+D^k$ However, where the target recursive encoder has more complicated feedback polynomials in its recursive part, then care must, be taken as to how the sigma function is applied to produce the corresponding soft-decision processing element in a decoder according to soft decision embodiments of the invention. This aspect will be described further with respect to FIG. 22.

More particularly, in FIG. 22(a) is shown a hard decision non-recursive encoder element having generator polynomial:

$g_0(D)=1+D^2+D^5$

As shown, this is implemented using two modulo-2 adders, with the output $b_n$ being:

$b_n=((a_n+a_{n-2})+a_{n-5})$ where + represents here a modulo-2 addition.

To obtain the equivalent soft decision input processing element, the modulo-2 adders may be replaced with the sigma function as described previously, but to obtain the final output the sigma functions need to be nested, as shown in FIG. 22(b). Here, as shown the final output of the equivalent soft decision input processing element is given by $\beta_n$, where:

$\beta_n = \Sigma(\Sigma(\alpha_n, \alpha_{n-2}), \alpha_{n-5})$

Here, the sigma function is the same as described previously, i.e.:

$$\sum(\alpha_n, \alpha_{n-k}) = \ln\left[\frac{1+e^{\alpha_n+\alpha_{n-k}}}{e^{\alpha_n}+e^{\alpha_{n-k}}}\right]$$

In further embodiments of the invention therefore, where more complicated generator polynomials are required to be represented, then a soft decision input can be used by producing a soft-decision input non-recursive encoding element having appropriately nested sigma functions in accordance with the above principles.

In other embodiments, one or several combinations of sigma operators with any number of inputs may be used:

$$\Sigma(\alpha_{n-k_1}, \alpha_{n-k_2}, \ldots, \alpha_{n-k_p}) = 2 \cdot \text{artanh}\left[\prod_{i=1}^{p} \tanh(\alpha_{n-k_i}/2)\right]$$

Eg: $\beta_n = 2 \cdot \text{artanh}[\tanh(\alpha_n/2) \cdot \tanh(\alpha_{n-2}/2) \cdot \tanh(\alpha_{n-5}/2)]$ Moreover, in further soft-decision input embodiments requiring more complicated generator polynomials, the approximation to the sigma function mentioned earlier may also be used. However, in this case, the nesting principle is not as important, as the sigma function approximation is very similar to a modulo-2 adder, and can accept multiple inputs. For example, considering representing the generator polynomial:

$g_0(D)=1+D^2+D^5$ then using the sigma function approximation, the output $\beta_n$ can be approximated as:

$\beta_n \approx [sgn(\alpha_n) \cdot sgn(\alpha_{n-2}) \cdot sgn(\alpha_{n-5})] \cdot \text{Min}(|\alpha_n|, |\alpha_{n-2}|, |\alpha_{n-5}|)$ More generally, this can be represented as:

$$\Sigma(\alpha_{n-k_1}, \alpha_{n-k_2}, \ldots, \alpha_{n-k_p}) \approx \left[\prod_{i=1}^{p} sgn(\alpha_{n-k_i})\right] \cdot \min_{1 \le i \le p}|\alpha_{n-k_i}|$$

Therefore, a single approximation function block can be provided, which accepts all three inputs thereto. Of course, in other embodiments, separate approximation function blocks can be provided, nested in the same manner as with the sigma function adders described previously.

Thus, as described, even when operating on soft decision inputs, pre- or post-processing elements corresponding to any desired generator polynomial required to complete the decoding provided by a conventional non-recursive (soft input) decoder can be obtained using the principles described above, and using either the sigma function equivalent to a modulo-2 adder, or the approximation thereto.

Figure 25:
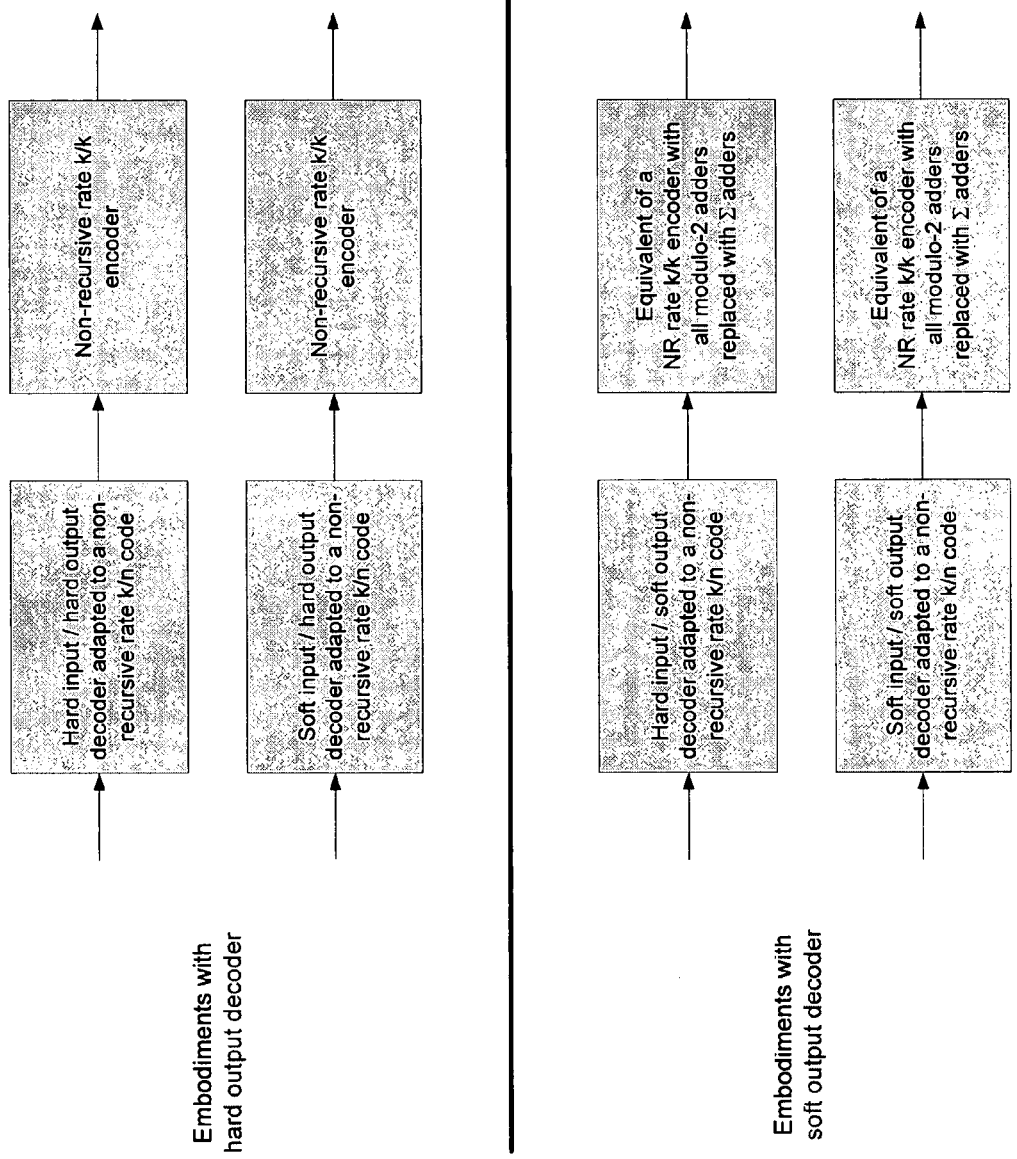
FIG. 25 is a diagram illustrating how hard decision and soft decision elements can be combined to provide further post-processing embodiments of the invention.

In further embodiments of the invention, it is possible to combine soft inputs with hard outputs, and vice versa. Conventional non-recursive code decoders which accept soft inputs and provide hard outputs, or vice versa, are known in the art and can be used in embodiments of the invention, with appropriate pre- or post-processing elements as previously described, depending on the inputs (soft or hard) or outputs (soft or hard) of the non-recursive code decoder. FIG. 25 gives examples of the various combinations of hard input/hard output, soft input/hard output, soft input/soft output, and hard input/soft output combinations which may be obtained using a post-processing element or elements, whereas FIG. 26 illustrates the same using a pre-processing element or elements. Generally, as mentioned previously, soft decision symbols provide a greater degree of information about the incoming signal, and hence soft decision symbols are preferably used as far down the processing chain as possible, provided that the additional information is being used. As soon as the additional information is not being used then the soft symbol is effectively being treated as a hard decision symbol, and the additional complexity of soft decision processing is then wasted.

Regarding converting from hard decisions to soft decisions, as a general rule there is no advantage in a reception chain, in converting hard-information into soft-information. Once the soft-information is lost, it cannot be recovered. However, a decoder does not really convert hard-information into soft-information. It replaces the "redundancy" in a stream of hard-decisions and converts it into reliability measures in a stream of soft-decision: note that the bit-rate is reduced. Therefore, we can say that there is no advantage in a reception chain, in converting hard-decisions into soft-decisions, except when it is associated with a processing (e.g. a decoder) which reduces the bit-rate.

The embodiments of the invention provide further advantages. For example, if the decoder arrangements of the embodiments are being implemented in an integrated transceiver IC, wherein the transceiver side is provided with an adaptable non-recursive encoder for encoding a bitstream to be transmitted, then the conventional decoder 420 of the embodiments can be provided on the receiver side, but the adaptable non-recursive encoder of the transmit side used to perform the non-recursive encoding required by non-recursive encoder 410 or 1320. This thus further provides for functionality re-use of components on the chip, which reduces overall component and gate count, and saves silicon area.

Various further modifications and adjustments may be made to the above described embodiments to provide further embodiments, any and all of which are intended to be encompassed by the appended claims.

Appendix 1: How Soft Decision Pre- or Post-Processing Relates to Hard Decision Pre- or Post-Processing The following description explains how the sigma function (and its approximation) described earlier and used in the soft decision input embodiments can take the place of the modulo-2 adder used in the hard decision input embodiments. Within the following, a modulo-2 adder is described as:

$$s = a + b$$

where + represents a modulo-2 addition, and a and b are the inputs to the modulo-2 adder, with s being the result. The equivalent sigma function is then $$\sigma = \Sigma(\alpha, \beta)$$

where $\alpha$ and $\beta$ are the inputs to the function, and $\sigma$ is the result.

1/ By definition, soft-decisions are the Log-Likelihood Ratios associated with the bits (hard-decisions) they represent:

$$\alpha = \ln\left[\frac{Prob(a=0)}{Prob(a=1)}\right] \quad \beta = \ln\left[\frac{Prob(b=0)}{Prob(b=1)}\right]$$

2/ Therefore the equivalent of the modulo-2 adder operating on soft-decisions must provide an output of the same nature:

$$\sigma = \ln\left[\frac{Prob(s=0)}{Prob(s=1)}\right]$$

3/ Elementary probabilities: Prob(a=0)+Prob(a=1)=1
Therefore:

$$\alpha = \ln\left[\frac{Prob(a=0)}{1 - Prob(a=0)}\right] = \ln\left[\frac{1 - Prob(a=1)}{Prob(a=1)}\right]$$

A little maths work leads to (same for b and $\beta$):

$$Prob(a=0) = \frac{e^\alpha}{1+e^\alpha} \text{ and } Prob(a=1) = \frac{1}{1+e^\alpha}$$

4/ Barely more advanced probabilities:

$$Prob(s=0) = Prob(a=0) \cdot Prob(b=0) + Prob(a=1) \cdot Prob(b=1)$$

5/ Combining results from 3/ and 4/:

$$Prob(s=0) = \frac{e^\alpha}{1+e^\alpha} \cdot \frac{e^\beta}{1+e^\beta} + \frac{1}{1+e^\alpha} \cdot \frac{1}{1+e^\beta}$$

$$= \frac{1 + e^{\alpha+\beta}}{(1+e^\alpha) \cdot (1+e^\beta)}$$

$$Prob(s=1) = 1 - Prob(s=0) = \frac{e^\alpha + e^\beta}{(1+e^\alpha) \cdot (1+e^\beta)}$$

6/ Hence the output which must be provided by the elementary block operating on soft-decisions:

$$\sigma(\alpha, \beta) = \ln\left[\frac{Prob(s=0)}{Prob(s=1)}\right] = \ln\left[\frac{1 + e^{\alpha+\beta}}{e^\alpha + e^\beta}\right]$$

7/ This defines the $\Sigma$ operator operating on soft-decisions which replaces the + (modulo 2) operator operating on hard-decisions:

$$\Sigma(x, y) = \ln\left[\frac{1 + e^{x+y}}{e^x + e^y}\right]$$

8/ Notice a remarkable property which can make implementation simpler:

$$\Sigma(x,y) \approx sgn(x) \cdot sgn(y) \cdot \text{Min}(|x|, |y|)$$

This means that sgn($\sigma$) is governed by the hard decision s, and that the reliability of the decision |$\sigma$| is well approximated as the minimum reliability of the components |$\alpha$| and |$\beta$|.

A few more details about the □ function:

$$\Sigma(x, y) = \ln\left[\frac{1 + e^{x+y}}{e^x + e^y}\right]$$

a/ Notice a symmetry:

$$\Sigma(x, -y) = \ln\left[\frac{1 + e^{x+y}}{e^x + e^{-y}}\right]$$

$$= \ln\left[\frac{e^y + e^x}{1 + e^{x+y}}\right]$$

$$= -\ln\left[\frac{1 + e^{x+y}}{e^x + e^y}\right] = -\Sigma(x, y)$$

b/ Using this result:

$$\Sigma(x, y) = \begin{cases} +\Sigma(x, |y|) & \text{if } y \geq 0 \\ -\Sigma(x, |y|) & \text{if } y \leq 0 \end{cases}$$

c/ This can be simplified as: $\Sigma(x,y) = \text{sgn}(y) \cdot \Sigma(x,|y|)$ $$\text{sgn}(t) = \begin{cases} +1 & \text{if } t > 0 \\ 0 & \text{if } t = 0 \\ -1 & \text{if } t < 0 \end{cases}$$

d/ Simple generalisation to the second variable:

$$\Sigma(x,y) = \text{sgn}(x) \cdot \text{sgn}(y) \cdot \Sigma(|x|,|y|)$$

e/ But for any x and y, we have: $\Sigma(|x|,|y|) \geq 0$ because:

$$1 + e^{|x|+|y|} - (e^{|x|} + e^{|y|}) = (1 - e^{|x|})(1 - e^{|y|})$$

where $1 - e^{|x|} \leq 0$ and $1 - e^{|x|} \leq 0$ so that $$\frac{1 + e^{|x|+|y|}}{e^{|x|} + e^{|y|}} \geq 1$$

f/ Combining d/ and e/ we can characterize the sign and the magnitude of $\Sigma(x,y)$ $$\begin{cases} \text{sgn}[\Sigma(x, y)] = \text{sgn}(x) \cdot \text{sgn}(y) \\ |\Sigma(x, y)| = \Sigma(|x|, |y|) \end{cases}$$

Let us now examine the above result in more detail, to show how the sigma function which replaces the modulo-2 adder of the hard decision encoder within the soft decision pre and post processing blocks can be approximated, to make the implementation easier:

1/ Interpretation of the sign of $\Sigma(x,y)$

This easily relates to the modulo-2 adder for the hard-decisions:

$z = x + y$

We have: $z=0$ when $(x==y)$ (both bits are equal)
$z=1$ when $(x\ !=y)$
For the soft-decisions this translates into:

$z = \Sigma(x,y)$

We have: $z>0$ when $(\text{sgn}(x)==\text{sgn}(y))$ (both soft decisions are of the same sign) $z<0$ when $(\text{sgn}(x)\ !=\text{sgn}(y))$ What this means is that when two soft-decisions are combined, the sign of the result is set according to the equivalent modulo-2 adder operating on hard-decisions 2/ Interpretation of the magnitude of $\Sigma(x,y)$ If we assume that one of the soft-decisions exponential is significantly larger than the other one:
$e^{|x|} >> e^{|y|}$ where by construction: $e^{|y \oplus|} > 1$ Then:

$1 + e^{|x|+|y|} \approx e^{|x|+|y|}$ $e^{|x|} + e^{|y|} \approx e^{|x|}$

Therefore:

$$|\Sigma(x, y)| \approx \ln\left[\frac{e^{|x|+|y|}}{e^{|x|}}\right] = |y|$$

This result can easily be generalised to the two variables as:
$|\Sigma(x,y)| \approx \text{Min}(|x|,|y|)$ What this means is that when two soft-decisions are combined, the reliability of the result is well approximated as the minimum reliability of the two.

3/ As a general result $\Sigma(x,y)$ can be well approximated as:

$\Sigma(x,y) \approx \text{sgn}(x) \cdot \text{sgn}(y) \cdot \text{Min}(|x|,|y|)$ Also, if n inputs $x_1, x_2, \ldots x_n$ have to be combined, this result can be generalised:

$$\sum(x_1, x_2, \ldots, x_n) \approx \prod_{i=1}^{n} \text{sgn}(x_i) \cdot \min_{1 \leq i \leq n} |x_i|$$

Note however, that an exact expression for $\Sigma(x_1, x_2, \ldots, x_n)$ can also be found (proven by induction):

$$\sum(x_1, x_2, \ldots, x_n) = \ln\left[\frac{\prod_{i=1}^{n}(e^{x_i} + 1) + \prod_{i=1}^{n}(e^{x_i} - 1)}{\prod_{i=1}^{n}(e^{x_i} + 1) - \prod_{i=1}^{n}(e^{x_i} - 1)}\right]$$

Using the relation:

$$\tanh(t/2) = \frac{e^t - 1}{e^t + 1}$$

we can now express $\Sigma(x_1, x_2, \ldots, x_n)$ as:

$$\sum(x_1, x_2, \ldots, x_n) = \ln\left[\frac{1 + \prod_{i=1}^{n} \tanh(x_i/2)}{1 - \prod_{i=1}^{n} \tanh(x_i/2)}\right]$$

And finally using the reciprocal relation:

$$\text{artanh}(u) = \frac{1}{2} \cdot \ln\left[\frac{1+u}{1-u}\right]$$

we get the final and shorter expression:

$$\sum(x_1, x_2, \ldots, x_n) = 2 \cdot ar\tanh\left[\prod_{i=1}^{n} \tanh(x_i/2)\right]$$

The invention claimed is:

1. An apparatus for decoding a recursive convolutional encoded bitstream, comprising:
   a decoder adapted to decode a non-recursive convolutional encoded bitstream; and
   a post-processing element arranged to receive the output of the decoder and apply a post-processing operation thereto;
   the decoder and the post-processing element operable together in turn to decode a received recursive convolutional encoded bitstream to provide a decoded bitstream;
   wherein the post-processing element includes a non-recursive (NR) encoder having a generator polynomial matrix $G_{NR}$ of generator polynomials g:

$$G_{NR}(D) = \begin{bmatrix} g_{1,0} & 0 & \ldots & 0 & 0 \\ 0 & g_{2,0} & 0 & 0 & 0 \\ \vdots & 0 & \ddots & 0 & \vdots \\ 0 & 0 & 0 & g_{k-1,0} & 0 \\ 0 & 0 & \ldots & 0 & g_{k,0} \end{bmatrix},$$

where k is an integer greater than or equal to 1 and D is a bit delay.

2. An apparatus according to claim 1, wherein the recursive convolutional encoded bitstream has been encoded by a recursive convolutional encoder (RCE) having a generator matrix $G_{RCE}$ of generator polynomials g:

$$G_{RCE}(D) = \begin{bmatrix} \frac{g_{1,1}}{g_{1,0}} & \ldots & \ldots & \ldots & \frac{g_{1,n}}{g_{1,0}} \\ \vdots & \ddots & & & \vdots \\ \vdots & & \ddots & & \vdots \\ \vdots & & & \ddots & \vdots \\ \frac{g_{k,1}}{g_{k,0}} & \ldots & \ldots & \ldots & \frac{g_{k,n}}{g_{k,0}} \end{bmatrix};$$

and
the decoder is adapted to decode a non-recursive convolutional encoded bitstream produced by a non-recursive convolutional encoder (NRCE) having a generator matrix $G_{NRCE}$ of generator polynomials g $$G_{NRCE}(D) = \begin{bmatrix} g_{1,1} & \ldots & \ldots & \ldots & g_{1,n} \\ \vdots & \ddots & & & \vdots \\ \vdots & & \ddots & & \vdots \\ \vdots & & & \ddots & \vdots \\ g_{k,1} & \ldots & \ldots & \ldots & g_{k,n} \end{bmatrix}$$

where n is an integer greater than or equal to k.

3. An apparatus according to claim 1, wherein the recursively encoded bitstream is represented by soft-decision symbols.

4. An apparatus according to claim 3, wherein the post-processing element comprises an input for receiving a soft decision bitstream $\alpha_n$, at least one symbol delay for producing at least one delayed soft decision bitstream $\alpha_{n-k}$, and at least one summer, wherein each summer is arranged to output an output according to the following:

$$\sum(\alpha_n, \alpha_{n-k}) = \ln\left[\frac{1 + e^{\alpha_n + \alpha_{n-k}}}{e^{\alpha_n} + e^{\alpha_{n-k}}}\right]$$

or more generally:

$$\sum(\alpha_{n-k_1}, \alpha_{n-k_2}, \ldots, \alpha_{n-k_p}) = 2 \cdot ar\tanh\left[\prod_{i=1}^{p} \tanh(\alpha_{n-k_i}/2)\right].$$

where n is an integer greater than or equal to k and p is an integer greater than or equal to 1.

5. An apparatus according to claim 3 wherein the post-processing element comprises an input for receiving a soft decision bitstream $\alpha_n$, at least one symbol delay for producing at least one delayed soft decision bitstream $\alpha_{n-k}$, and at least one summer, wherein each summer is arranged to output an output according to the following:

$$\sum(\alpha_{n-k_1}, \alpha_{n-k_2}, \ldots, \alpha_{n-k_p}) \approx \left[\prod_{i=1}^{p} \text{sgn}(\alpha_{n-k_i})\right] \cdot \min_{1 \leq i \leq p} |\alpha_{n-k_i}|.$$

where n is an integer greater than or equal to k and p is an integer greater than or equal to 1.

6. An apparatus according to claim 1, wherein the decoder is one selected from the group comprising: a sequential decoder; and a maximum likelihood decoder.

7. An apparatus according to claim 6, wherein where the decoder is a sequential decoder then the decoder is a Fano decoder.

8. An apparatus according to claim 6, wherein where the decoder is a maximum likelihood decoder then the decoder is a Viterbi decoder.

9. An apparatus for decoding a recursive convolutional encoded bitstream, comprising;
   a pre-processing element arranged to receive the recursive convolutional encoded bitstream and to apply a pre-processing operation thereto; and
   a decoder adapted to decode a non-recursive convolutional encoded bitstream;
   the pre-processing element and the decoder operable together in turn to decode a received recursive convolutional encoded bitstream to provide a decoded bitstream;
   wherein the pre-processing element includes a non-recursive (NR) encoder having a generator matrix $G_{NR}$ of generator polynomials g of n columns and n rows of the form:

$$G_{NR}(D) = \begin{bmatrix} g_{1,0} & 0 & \ldots & 0 & 0 \\ 0 & g_{1,0} & 0 & 0 & 0 \\ \vdots & 0 & \ddots & 0 & \vdots \\ 0 & 0 & 0 & g_{1,0} & 0 \\ 0 & 0 & \ldots & 0 & g_{1,0} \end{bmatrix},$$

where D is a bit delay.

10. An apparatus according to claim 9, wherein the recursive convolutional encoded bitstream has been encoded by a recursive convolutional encoder (RCE) having a generator matrix $G_{RCE}$ of generator polynomials g $$G_{RCE}(D) = \begin{bmatrix} \frac{g_{1,1}}{g_{1,0}} & \cdots & \cdots & \cdots & \frac{g_{1,n}}{g_{1,0}} \\ \vdots & \ddots & & & \vdots \\ \vdots & & \ddots & & \vdots \\ \vdots & & & \ddots & \vdots \\ \frac{g_{k,1}}{g_{1,0}} & \cdots & \cdots & \cdots & \frac{g_{k,n}}{g_{1,0}} \end{bmatrix};$$

and the decoder is adapted to decode a non-recursive convolutional encoded bitstream produced by a non-recursive convolutional encoder (NRCE) having a generator matrix $G_{NRCE}$ of generator polynomials g $$G_{NRCE}(D) = \begin{bmatrix} g_{1,1} & \cdots & \cdots & \cdots & g_{1,n} \\ \vdots & \ddots & & & \vdots \\ \vdots & & \ddots & & \vdots \\ \vdots & & & \ddots & \vdots \\ g_{k,1} & \cdots & \cdots & \cdots & g_{k,n} \end{bmatrix}$$

where k is an integer greater than or equal to 1, and n is an integer greater than or equal to k.

11. An apparatus according to claim 9, wherein the recursively encoded bitstream is represented by soft-decision symbols.

12. An apparatus according to claim 11, wherein the pre-processing element comprises an input for receiving a soft decision bitstream $\alpha_n$, at least one symbol delay for producing at least one delayed soft decision bitstream $\alpha_{n-k}$, and at least one summer, wherein each summer is arranged to output an output according to the following:

$$\sum(\alpha_n, \alpha_{n-k}) = \ln\left[\frac{1 + e^{\alpha_n + \alpha_{n-k}}}{e^{\alpha_n} + e^{\alpha_{n-k}}}\right]$$

or more generally:

$$\Sigma(\alpha_{n-k_1}, \alpha_{n-k_2}, \ldots, \alpha_{n-k_p}) = 2 \cdot artanh\left[\prod_{i=1}^{p} \tanh(\alpha_{n-k_i}/2)\right].$$

where k is an integer greater than or equal to 1, n is an integer greater than or equal to k, and p is an integer greater than or equal to 1.

13. An apparatus according to claim 11 wherein the pre-processing element comprises an input for receiving a soft decision bitstream $\alpha_n$, at least one symbol delay for producing at least one delayed soft decision bitstream $\alpha_{n-k}$, and at least one summer, wherein each summer is arranged to output an output according to the following:

$$\Sigma(\alpha_{n-k_1}, \alpha_{n-k_2}, \ldots, \alpha_{n-k_p}) \approx \left[\prod_{i=1}^{p} \text{sgn}(\alpha_{n-k_i})\right] \cdot \min_{1 \leq i \leq p} |\alpha_{n-k_i}|.$$

where k is an integer greater than or equal to 1, n is an integer greater than or equal to k, and p is an integer greater than or equal to 1.

14. An apparatus according to claim 9, wherein the decoder is one selected from the group comprising: a sequential decoder; and a maximum likelihood decoder.

15. An apparatus according to claim 14, wherein where the decoder is a sequential decoder then the decoder is a Fano decoder.

16. An apparatus according to claim 14, wherein where the decoder is a maximum likelihood decoder then the decoder is a Viterbi decoder.

17. A method for decoding a recursive convolutional encoded bitstream, comprising applying a decoding operation to the recursive convolutional encoded bitstream, followed by a post-processing operation, wherein the decoding operation is arranged to decode a non-recursive convolutional encoded bitstream; the decoding operation and the post-processing operation operable together in turn to decode the received recursive convolutional encoded bitstream to provide a decoded bitstream; wherein the post-processing operation is a non-recursive (NR) encoding operation having a generator matrix $G_{NR}$ of generator polynomials g:

$$G_{NR}(D) = \begin{bmatrix} g_{1,0} & 0 & \cdots & 0 & 0 \\ 0 & g_{2,0} & 0 & 0 & 0 \\ \vdots & 0 & \ddots & 0 & \vdots \\ 0 & 0 & 0 & g_{k-1,0} & 0 \\ 0 & 0 & \cdots & 0 & g_{k,0} \end{bmatrix},$$

where k is an integer greater than or equal to 1 and D is a bit delay.

18. A method according to claim 17, wherein the recursive convolutional encoded bitstream has been encoded by a recursive convolutional encoder (RCE) having a generator matrix $G_{RCE}$ of generator polynomials g $$G_{RCE}(D) = \begin{bmatrix} \frac{g_{1,1}}{g_{1,0}} & \cdots & \cdots & \cdots & \frac{g_{1,n}}{g_{1,0}} \\ \vdots & \ddots & & & \vdots \\ \vdots & & \ddots & & \vdots \\ \vdots & & & \ddots & \vdots \\ \frac{g_{k,1}}{g_{k,0}} & \cdots & \cdots & \cdots & \frac{g_{k,n}}{g_{k,0}} \end{bmatrix};$$

and the decoding operation is adapted to decode a nonrecursive convolutional encoded bitstream produced by a non-recursive convolutional encoder (NRCE) having a generator matrix $G_{NRCE}$ of generator polynomials g $$G_{NRCE}(D) = \begin{bmatrix} g_{1,1} & \cdots & \cdots & \cdots & g_{1,n} \\ \vdots & \ddots & & & \vdots \\ \vdots & & \ddots & & \vdots \\ \vdots & & & \ddots & \vdots \\ g_{k,1} & \cdots & \cdots & \cdots & g_{k,n} \end{bmatrix}$$

where n is an integer greater than or equal to k.

19. A method according to claim 17, wherein the recursively encoded bitstream is represented by soft-decision symbols.

20. A method according to claim 19, wherein the post-processing operation comprises receiving a soft decision bitstream $\alpha_n$, delaying the received soft decision bitstream to produce at least one delayed soft decision bitstream $\alpha_{n-k}$, and summing soft decision bitstream and the at least one delayed soft decision bitstream according to the following:

$$\sum (\alpha_n, \alpha_{n-k}) = \ln\left[\frac{1+e^{\alpha_n+\alpha_{n-k}}}{e^{\alpha_n}+e^{\alpha_{n-k}}}\right]$$

or more generally:

$$\Sigma(\alpha_{n-k_1}, \alpha_{n-k_2}, \ldots, \alpha_{n-k_p}) = 2 \cdot ar\tanh\left[\prod_{i=1}^{p} \tanh(\alpha_{n-k_i}/2)\right]$$

to produce an output soft decision bitstream, where n is an integer greater than or equal to k, and p is an integer greater than or equal to 1.

21. A method according to claim 19, wherein the post-processing operation comprises receiving a soft decision bitstream $\alpha_n$, delaying the received soft decision bitstream to produce at least one delayed soft decision bitstream $\alpha_{n-k}$, and processing the soft decision bitstream and the at least one delayed soft decision bitstream according to the following:

$$\Sigma(\alpha_{n-k_1}, \alpha_{n-k_2}, \ldots, \alpha_{n-k_p}) \approx \left[\prod_{i=1}^{p} \text{sgn}(\alpha_{n-k_i})\right] \cdot \min_{1 \leq i \leq p}|\alpha_{n-k_i}|$$

to produce an output soft decision bitstream, where n is an integer greater than or equal to k, and p is an integer greater than or equal to 1.

22. A method according to claim 17, wherein the decoding operation is one selected from the group comprising: a sequential decoding operation; and a maximum likelihood decoding operation.

23. A method according to claim 22, wherein where the decoding operation is a sequential decoding operation then the operation operates according to the Fano algorithm.

24. A method according to claim 22, wherein where the decoding operation is a maximum likelihood decoding operation then the operation operates according to the Viterbi algorithm.

25. A method for decoding a recursive convolutional encoded bitstream, comprising a pre-processing operation arranged to receive the recursive convolutional encoded bitstream and to apply a pre-processing operation thereto followed by a decoding operation, the decoding operation adapted to decode a non-recursive convolutional encoded bitstream; wherein the pre-processing operation and the decoding operation are operable together in turn to decode the received recursive convolutional encoded bitstream to provide a decoded bitstream; wherein the pre-processing operation is a non-recursive (NR) encoding having a generator matrix $G_{NR}$ of generator polynomials g of n columns and n rows of the form:

$$G_{NR}(D) = \begin{bmatrix} g_{1,0} & 0 & \ldots & 0 & 0 \\ 0 & g_{1,0} & 0 & 0 & 0 \\ \vdots & 0 & \ddots & 0 & \vdots \\ 0 & 0 & 0 & g_{1,0} & 0 \\ 0 & 0 & \ldots & 0 & g_{1,0} \end{bmatrix},$$

where D is a bit delay.

26. A method according to claim 25, wherein the recursive convolutional encoded bitstream has been encoded by a recursive convolutional encoder (RCE) having a generator matrix $G_{RCE}$ of generator polynomials g $$G_{RCE}(D) = \begin{bmatrix} \frac{g_{1,1}}{g_{1,0}} & \ldots & \ldots & \ldots & \frac{g_{1,n}}{g_{1,0}} \\ \vdots & \ddots & & & \vdots \\ \vdots & & \ddots & & \vdots \\ \vdots & & & \ddots & \vdots \\ \frac{g_{k,1}}{g_{1,0}} & \ldots & \ldots & \ldots & \frac{g_{k,n}}{g_{1,0}} \end{bmatrix};$$

and the decoding operation is adapted to decode a non-recursive convolutional encoded bitstream produced by a non-recursive convolutional encoder (NRCE) having a generator matrix $G_{NRCE}$ of generator polynomials g $$G_{NRCE}(D) = \begin{bmatrix} g_{1,1} & \ldots & \ldots & \ldots & g_{1,n} \\ \vdots & \ddots & & & \vdots \\ \vdots & & \ddots & & \vdots \\ \vdots & & & \ddots & \vdots \\ g_{k,1} & \ldots & \ldots & \ldots & g_{k,n} \end{bmatrix}$$

where k is an integer greater than or equal to 1, and n is an integer greater than or equal to k.

27. A method according to claim 25, wherein the recursively encoded bitstream is represented by soft-decision symbols.

28. A method according to claim 27, wherein the pre-processing operation comprises receiving a soft decision bitstream $\alpha_n$, delaying the received soft decision bitstream to produce at least one delayed soft decision bitstream $\alpha_{n-k}$, and summing the soft decision bitstream and the at least one delayed soft decision bitstream according to the following:

$$\sum (\alpha_n, \alpha_{n-k}) = \ln\left[\frac{1+e^{\alpha_n+\alpha_{n-k}}}{e^{\alpha_n}+e^{\alpha_{n-k}}}\right]$$

or more generally:

$$\Sigma(\alpha_{n-k_1}, \alpha_{n-k_2}, \ldots, \alpha_{n-k_p}) = 2 \cdot ar\tanh\left[\prod_{i=1}^{p} \tanh(\alpha_{n-k_i}/2)\right]$$

to produce an output soft decision bitstream, where k is an integer greater than or equal to 1, n is an integer greater than or equal to k, and p is an integer greater than or equal to 1.

29. A method according to claim 27, wherein the pre-processing operation comprises receiving a soft decision bitstream $\alpha_n$, delaying the received soft decision bitstream to produce at least one delayed soft decision bitstream $\alpha_{n-k}$, and processing the soft decision bitstream and the at least one delayed soft decision bitstream according to the following:

$$\Sigma(\alpha_{n-k_1}, \alpha_{n-k_2}, \ldots, \alpha_{n-k_p}) \approx \left[\prod_{i=1}^{p} \text{sgn}(\alpha_{n-k_i})\right] \cdot \min_{1 \leq i \leq p} |\alpha_{n-k_i}|$$

to produce an output soft decision bitstream, where k is an integer greater than or equal to 1, n is an integer greater than or equal to k, and p is an integer greater than or equal to 1.

30. A method according to any of claim 25, wherein the decoding operation is one selected from the group comprising: a sequential decoding operation; and a maximum likelihood decoding operation.

31. A method according to claim 30, wherein where the decoding operation is a sequential decoding operation then the operation operates according to the Fano algorithm.

32. A method according to claim 30, wherein where the decoding operation is a maximum likelihood decoding operation then the operation operates according to the Viterbi algorithm.

33. A software program or suite of software programs arranged such that when run on a processing device the software program or the suite of software programs cause the processing device to operate in accordance with the method of claim 17, in combination with a non-transitory computer-readable storage medium storing the software program or at least one of the suite of software programs.

34. A software program or suite of software programs arranged such that when run on a processing device the software program or the suite of software programs cause the processing device to operate in accordance with the method of claim 25, in combination with a non-transitory computer-readable storage medium storing the software program or at least one of the suite of software programs.

* * * * *

UNITED STATES PATENT AND TRADEMARK OFFICE
CERTIFICATE OF CORRECTION

PATENT NO. : 8,627,187 B2
APPLICATION NO. : 12/663167
DATED : January 7, 2014
INVENTOR(S) : Chappaz It is certified that error appears in the above-identified patent and that said Letters Patent is hereby corrected as shown below:

On the Title Page, in Item (56), under "OTHER PUBLICATIONS", in Column 2, Line 1, delete "et al," and insert -- et al., --, therefor.

On Title Page 2, in Item (56), under "OTHER PUBLICATIONS", in Column 1, Line 1, delete "et al," and insert -- et al., --, therefor.

On Title Page 2, in Item (56), under "OTHER PUBLICATIONS", in Column 2, Line 3, delete "et al, "Interative" and insert -- et al., "Iterative --, therefor.

On Title Page 2, in Item (56), under "OTHER PUBLICATIONS", in Column 2, Line 4, delete "Transctions" and insert -- Transactions --, therefor.

In the Specification:

In Column 1, Line 53, delete "bitstream;" and insert -- bitstream, --, therefor.

In Column 4, Line 13, delete "sixth," and insert -- sixth --, therefor.

In Column 10, Line 49, delete "receiving," and insert -- receiving --, therefor.

In Column 12, Line 45, delete "DESCRIPTION" and insert -- DETAILED DESCRIPTION --, therefor.

In Column 15, Line 33, delete "representation," and insert -- representation --, therefor.

In Column 18, Line 22, delete "interleaved" and insert -- interleaved. --, therefor.

In Column 18, Line 27, delete "interleaved stream" and insert -- interleaved stream. --, therefor.

Signed and Sealed this
Twenty-ninth Day of April, 2014

Michelle K. Lee
*Deputy Director of the United States Patent and Trademark Office*

CERTIFICATE OF CORRECTION (continued)
U.S. Pat. No. 8,627,187 B2

In Column 24, Line 49, delete "et al" and insert -- et al. --, therefor.

In Column 26, Line 22, delete "hard decisions:" and insert -- hard decisions. --, therefor.

In Column 27, Line 34, delete "kin" and insert -- k/n --, therefor.

In Column 27, Line 37, delete "can be," and insert -- can be --, therefor.

In Column 27, Line 51, delete "must," and insert -- must --, therefor.

In Column 31, Line 30, insert -- where --, therefor.

In Column 32, Line 5, delete "hard-decisions" and insert -- hard-decisions. --, therefor.

In the Claims:

In Column 33, Line 54, in Claim 2, delete "$G_{NRCE}$of" and insert -- $G_{NRCE}$ of --, therefor.

In Column 34, Line 21, in Claim 5, delete "claim 3" and insert -- claim 3, --, therefor.

In Column 34, Line 45, in Claim 9, delete "comprising;" and insert -- comprising: --, therefor.

In Column 34, Line 55, in Claim 9, delete "$G_{NR}$of" and insert -- $G_{NR}$ of --, therefor.

In Column 35, Line 62, in Claim 13, delete "claim 11" and insert -- claim 11, --, therefor.

In Column 37, Line 8, in Claim 20, delete "summing soft" and insert -- summing the soft --, therefor.